(12) United States Patent
Fujita et al.

(10) Patent No.: US 9,197,826 B2
(45) Date of Patent: Nov. 24, 2015

(54) METHOD FOR CONTROLLING SOLID-STATE IMAGE PICKUP DEVICE

(75) Inventors: Kazuki Fujita, Hamamatsu (JP); Ryuji Kyushima, Hamamatsu (JP); Harumichi Mori, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/982,527

(22) PCT Filed: Dec. 14, 2011

(86) PCT No.: PCT/JP2011/078954
§ 371 (c)(1),
(2), (4) Date: Jul. 30, 2013

(87) PCT Pub. No.: WO2012/105129
PCT Pub. Date: Aug. 9, 2012

(65) Prior Publication Data
US 2013/0308030 A1    Nov. 21, 2013

(30) Foreign Application Priority Data

Feb. 1, 2011 (JP) .................. 2011-019988
Jun. 1, 2011 (JP) .................. 2011-123574

(51) Int. Cl.
| H04N 3/14 | (2006.01) |
| H04N 5/335 | (2011.01) |
| H04N 5/347 | (2011.01) |
| H04N 5/345 | (2011.01) |
| H04N 5/217 | (2011.01) |
| H04N 5/374 | (2011.01) |
| H01L 27/146 | (2006.01) |
| H04N 5/32 | (2006.01) |

(52) U.S. Cl.
CPC .......... *H04N 5/347* (2013.01); *H01L 27/14656* (2013.01); *H01L 27/14658* (2013.01); *H01L 27/14692* (2013.01); *H04N 5/2175* (2013.01); *H04N 5/335* (2013.01); *H04N 5/345* (2013.01); *H04N 5/3456* (2013.01); *H04N 5/374* (2013.01); *H04N 5/32* (2013.01)

(58) Field of Classification Search
USPC ......... 348/294–324; 250/208.1; 257/290–292
IPC .................. H04N 5/335,5/345, 5/347, 5/3456, H04N 5/2175, 5/357, 5/32, 5/374; H01L 27/14692, 27/14658, 27/14656
See application file for complete search history.

(56) References Cited

U.S. PATENT DOCUMENTS

2005/0117038 A1* 6/2005 Matsuyama .................. 348/249
2008/0192132 A1 8/2008 Bechtel et al.

FOREIGN PATENT DOCUMENTS

| JP | 9-321267 A | 12/1997 |
| JP | 11-318877 A | 11/1999 |

(Continued)

*Primary Examiner* — Yogesh Aggarwal
(74) *Attorney, Agent, or Firm* — Drinker Biddle & Reath LLP

(57) ABSTRACT

Charges accumulated in pixels contained in one or a plurality of readout object rows that form a partial region of a photo-detecting region are selectively read out in each of the L times (L is an integer not less than 2) of imaging frames, and in each of the L times of imaging frames, resetting of charges accumulated in pixels contained in only a part of non-readout object rows is performed, as well as, resetting is performed at least once in a period of the L times of imaging frames for each of the two or more non-readout object rows. Accordingly, a control method for a solid-state imaging element capable of reducing the time required per one imaging frame and reducing load on the peripheral circuit when selectively reading out charges accumulated in pixels in a partial region of the photodetecting region is realized.

10 Claims, 19 Drawing Sheets

(56) References Cited

FOREIGN PATENT DOCUMENTS

| | | |
|---|---|---|
| JP | 2007-158741 | 6/2007 |
| JP | 2009-038761 | 2/2009 |
| JP | 2009-165051 A | 7/2009 |
| JP | 2010-093363 | 4/2010 |
| JP | 2010-518746 A | 5/2010 |

* cited by examiner

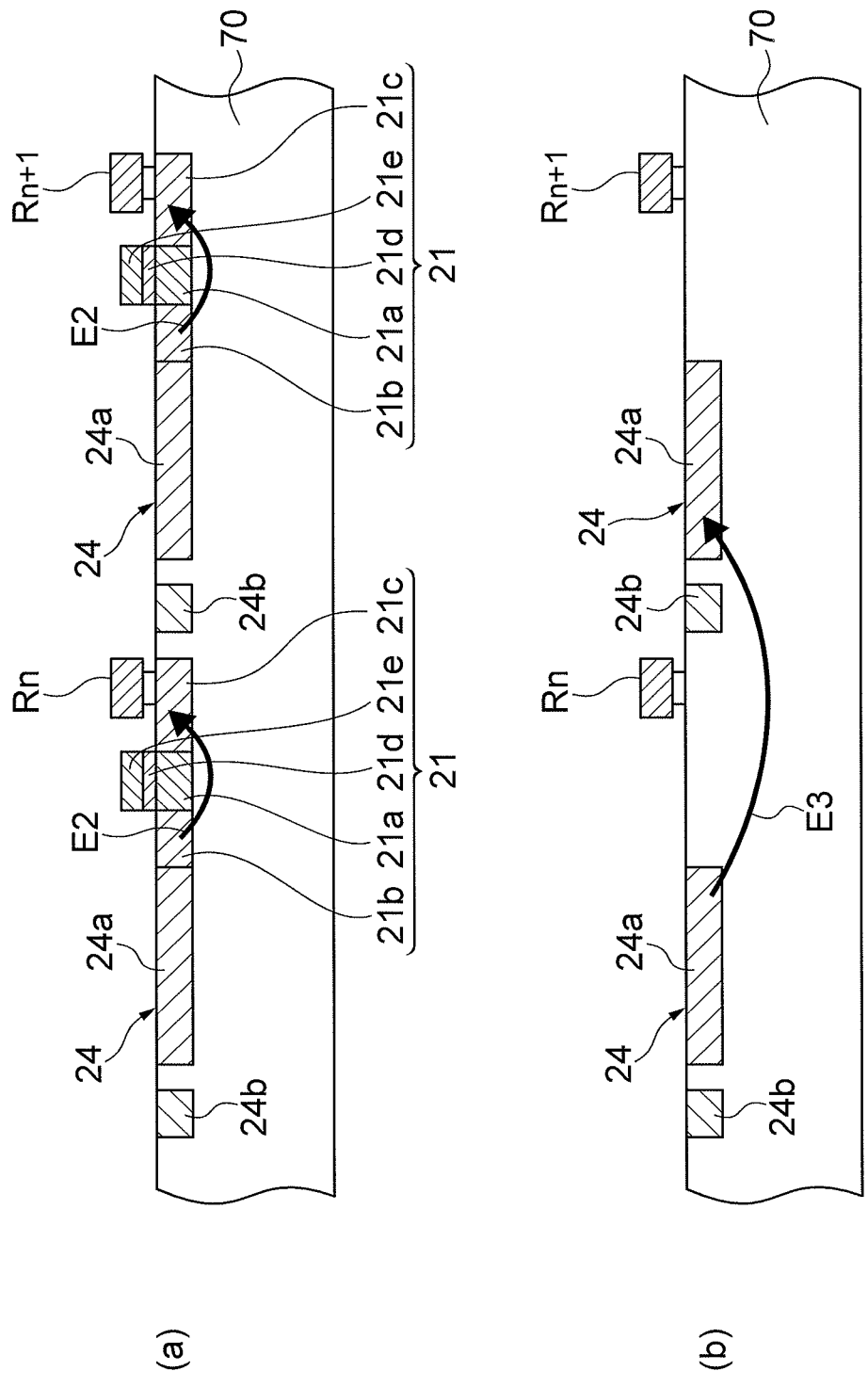

METHOD FOR CONTROLLING SOLID-STATE IMAGE PICKUP DEVICE

TECHNICAL FIELD

The present invention relates to a control method for a solid-state imaging element.

BACKGROUND ART

Patent Document 1 discloses a control method for an X-ray diagnostic apparatus including an X-ray detector. In this method, first X-ray irradiation is performed to read out pixel data from the X-ray detector, a partial region where pixel data should be collected is selected from the X-ray detector based on the pixel data, and then second X-ray irradiation is performed to read out pixel data from the partial region of the X-ray detector. Then, when reading out pixel data from the partial region of the X-ray detector, all pixel data in a remaining region of the X-ray detector are removed simultaneously (or sequentially) in respective imaging frames.

CITATION LIST

Patent Literature

Patent Document 1: Japanese Patent Application Laid-Open No. H11-318877

SUMMARY OF INVENTION

Technical Problem

A solid-state imaging element includes a photodetecting region in which a plurality of pixels are disposed two-dimensionally over a plurality of rows and a plurality of columns. In the respective pixels, photodiodes for converting incident light into electrons are disposed. The photodiode of each of the pixels is connected to a readout wiring line arranged for each column via a switch, and a charge accumulated in the photodiode flows out to the readout wiring line as a result of bringing the switch into a connected state.

As one of the operation methods of a solid-state imaging element with such a configuration, there is a so-called partial readout operation, which is for selectively reading out only charges accumulated in pixels in a partial region (hereinafter, referred to as an interest region) of a photodetecting region. In this partial readout operation, in an interest region where charges are read out, because the photodiodes are reset every time charges are read out in respective pixels, there is no case that charges are excessively accumulated in the photodiodes to cause an overflow. However, in a remaining region (hereinafter, referred to as a non-interest region) where charges are not read out, charges are continuously accumulated in the photodiodes of respective pixels to cause an overflow. When an overflow occurs, the overflowed charge enters into peripheral pixels to have influence on imaging data of the peripheral pixels. Therefore, it becomes necessary to reset the photodiodes of respective pixels contained in the non-interest region. For example, in the method described in Patent Document 1, the photodiodes of all pixels contained in a non-interest region are simultaneously or sequentially reset for every imaging frame.

However, for control of a solid-state imaging element, it is also demanded to reduce the time required per one imaging frame (frame rate) as much as possible. When the photodiodes of all pixels contained in a non-interest region are reset sequentially in respective imaging frames, this contributes to prolonging the required time for the respective imaging frames. In particular, the larger the area of the photodetecting region and the larger the number of pixels to compose the photodetecting region, the longer time is required for resetting the photodiodes in the non-interest region, and the required time for imaging frames is further prolonged. To cope therewith, Patent Document 1 also discloses a method for simultaneously resetting the photodiodes of all pixels contained in a non-interest region in respective imaging frames. However, in such a method, a large current flows to the wiring line connected to the photodiodes at the moment the photodiodes in the non-interest region are reset, so that there is a large load on a peripheral circuit such as a power supply.

The present invention has been made in view the above problem, and an object thereof is to provide a control method for a solid-state imaging element capable of reducing the time required per one imaging frame and reducing load on the peripheral circuit when selectively reading out charges accumulated in pixels in a partial region of the photodetecting region.

Solution to Problem

In order to solve the above-described problem, a control method for a solid-state imaging element according to the present invention is a control method for a solid-state imaging element including a photodetecting region having M×N (M is an integer not less than 3, N is an integer not less than 2) pixels each including a photodiode and a readout switch connected at one end to the photodiode that are arrayed two-dimensionally in M rows and N columns, and has a configuration of selectively reading out, in each of the L times (L is an integer not less than 2) of imaging frames, charges accumulated in the pixels contained in one or a plurality of rows (hereinafter, referred to as readout object rows) that form a partial region of the photodetecting region, and in each of the L times of imaging frames, performing a removing processing of charges accumulated in the pixels contained in a part of the two or more other rows (hereinafter, referred to as non-readout object rows) than the readout object rows, as well as performing the removing processing at least once in a period of the L times of imaging frames for each of the two or more non-readout object rows.

In the control method for a solid-state imaging element described above, a so-called partial readout operation, which is for selectively reading out, in each of the L times of imaging frames, charges accumulated in the pixels contained in the readout object rows that form a partial region (corresponding to the foregoing interest region) of the photodetecting region, is performed. Further, in this control method, a removing processing (resetting) of charges accumulated in the pixels contained in a part of the two or more non-readout object rows (corresponding to the foregoing non-interest region) is performed in each of the L times of imaging frames. Also, this removing processing (resetting) is performed at least once in a period of the L times of imaging frames for each of the two or more non-readout object rows.

That is, in the above-described control method, all of the two or more non-readout object rows are not reset in the respective imaging frames, but only a part thereof is reset. Therefore, in the case of sequentially resetting a plurality of non-readout object rows in the respective imaging frames, the time required per one imaging frame can be reduced by this control method. In particular, the larger the area of the photodetecting region and the larger the number of pixels to compose the photodetecting region, the more this effect becomes prominent. Moreover, in the case of simultaneously resetting a plurality of non-readout object rows in the respective imaging frames, current that flows to the wiring line connected to the photodiodes can be reduced, and load on the peripheral circuit such as a power supply can be reduced.

Moreover, a control method for a solid-state imaging element according to the present invention is a control method for a solid-state imaging element including a photodetecting region having M×N (M is an integer not less than 3, N is an integer not less than 2) pixels each including a photodiode and a readout switch connected at one end to the photodiode that are arrayed two-dimensionally in M rows and N columns, and has a configuration of selectively reading out, in each of the L times (L is an integer not less than 2) of imaging frames, charges accumulated in the pixels contained in one or a plurality of rows (hereinafter, referred to as readout object rows) that form a partial region of the photodetecting region, and in each of the L times of imaging frames, performing a removing processing of charges accumulated in the pixels contained in a part of the two or more rows included in the other rows (hereinafter, referred to as non-readout object rows) than the readout object rows, as well as performing the removing processing at least once in a period of the L times of imaging frames for each of the two or more rows.

In the control method for a solid-state imaging element described above, charges accumulated in the pixels contained in the readout object rows are selectively read out in each of the L times of imaging frames. Further, in this control method, a removing processing (resetting) of charges accumulated in the pixels contained in a part of the two or more rows in the non-readout object rows is performed in each of the L times of imaging frames. Also, this removing processing (resetting) is performed at least once in a period of the L times of imaging frames for each of the two or more rows.

That is, in the above-described control method, all of the two or more rows included in the non-readout object rows are not reset in the respective imaging frames, but only a part thereof is reset. Therefore, in the case of sequentially resetting a plurality of non-readout object rows in the respective imaging frames, the time required per one imaging frame can be reduced by this control method. Moreover, in the case of simultaneously resetting a plurality of non-readout object rows in the respective imaging frames, current that flows to the wiring line connected to the photodiodes can be reduced, and load on the peripheral circuit such as a power supply can be reduced.

Advantageous Effects of Invention

The control method for a solid-state imaging element by the present invention is capable of reducing the time required per one imaging frame and reducing load on the peripheral circuit when selectively reading out charges accumulated in pixels in a partial region of the photodetecting region.

BRIEF DESCRIPTION OF DRAWINGS

FIG. 19 includes views for explaining an overflow state at partial readout time when a photodetecting region is formed on a p-type monocrystalline silicon substrate.

DESCRIPTION OF EMBODIMENTS

Hereinafter, embodiments of a control method for a solid-state imaging element by the present invention will be described in detail with reference to the accompanying drawings. Also, the same components will be denoted with the same reference symbols in the description of the drawings, and overlapping description will be omitted.

Figure 1:
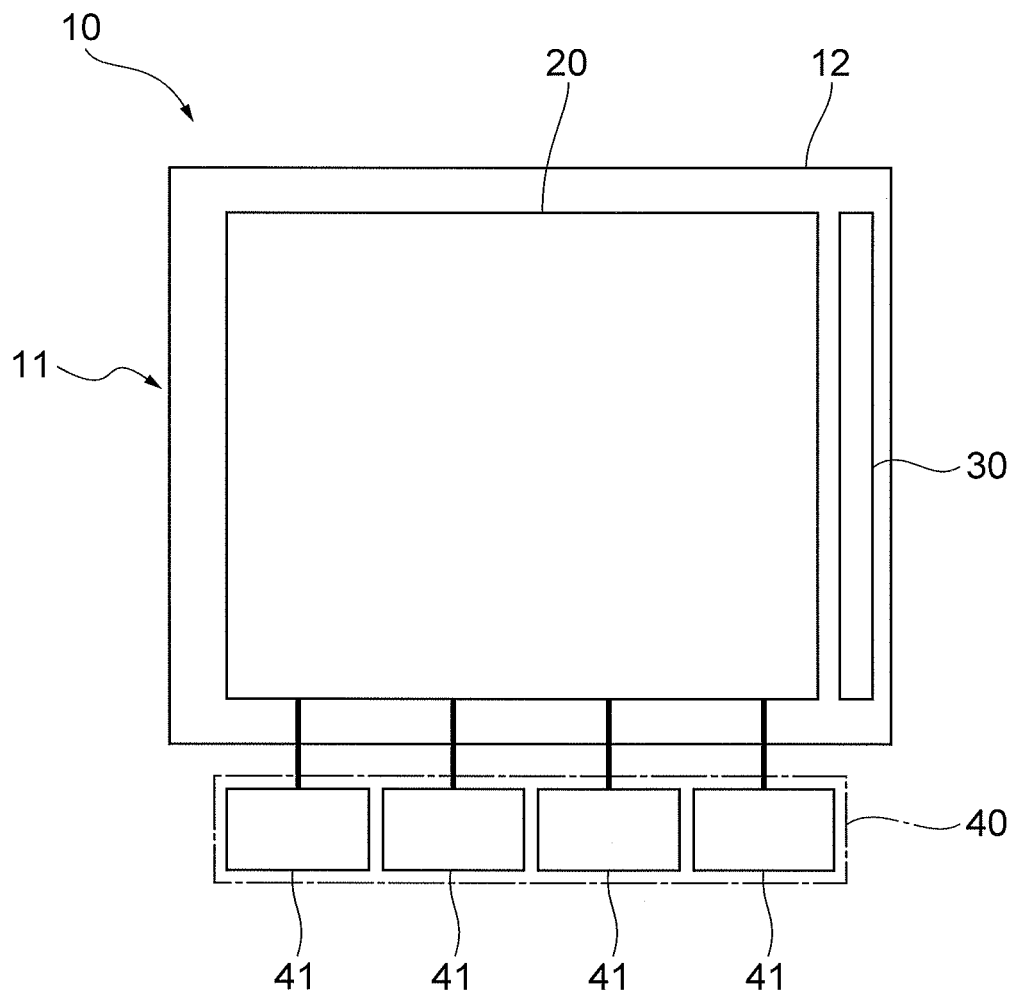
FIG. 1 is a plan view showing a solid-state imaging device.
Figure 2:
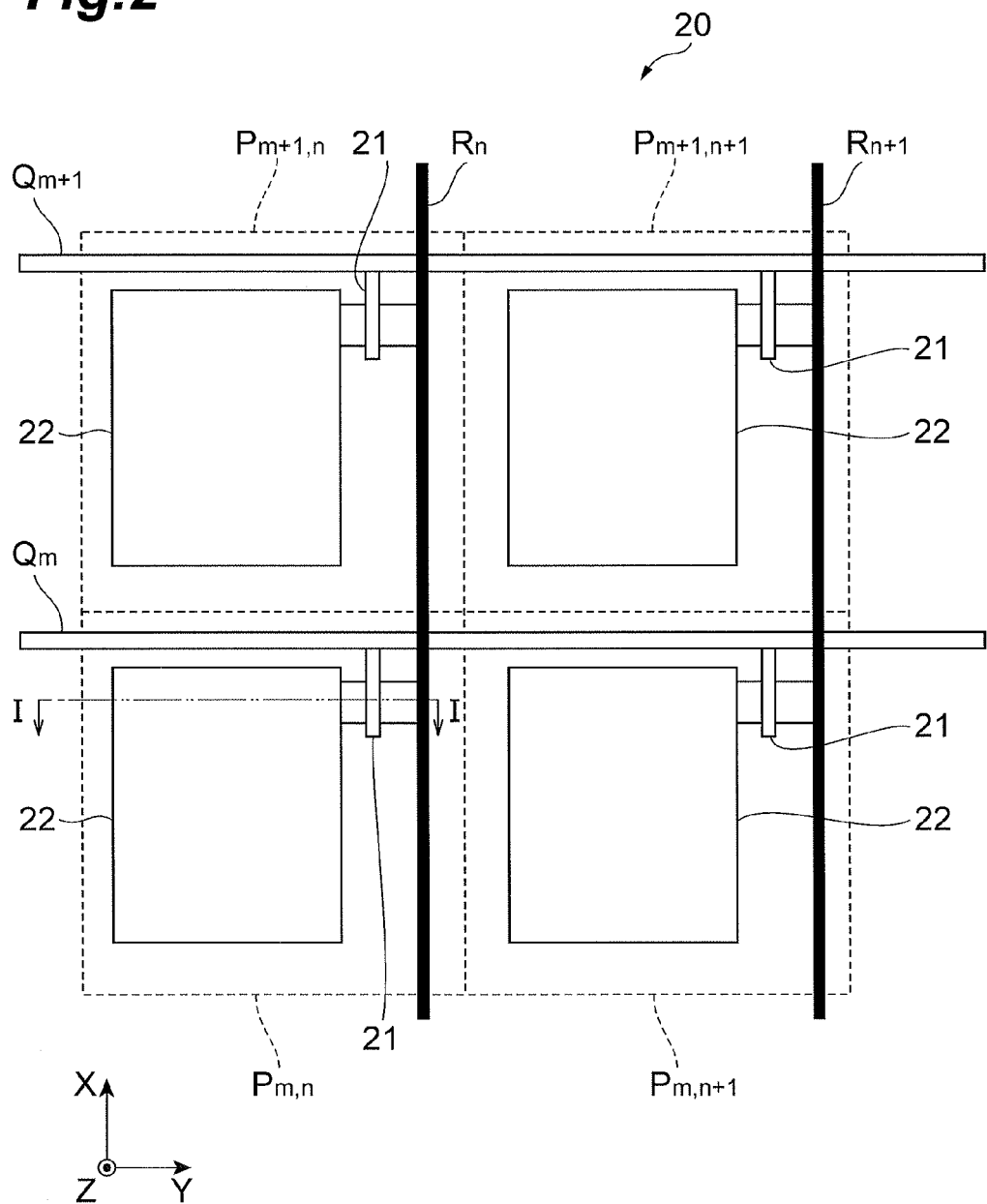
FIG. 2 is a partially enlarged plan view of the solid-state imaging device.
Figure 3:
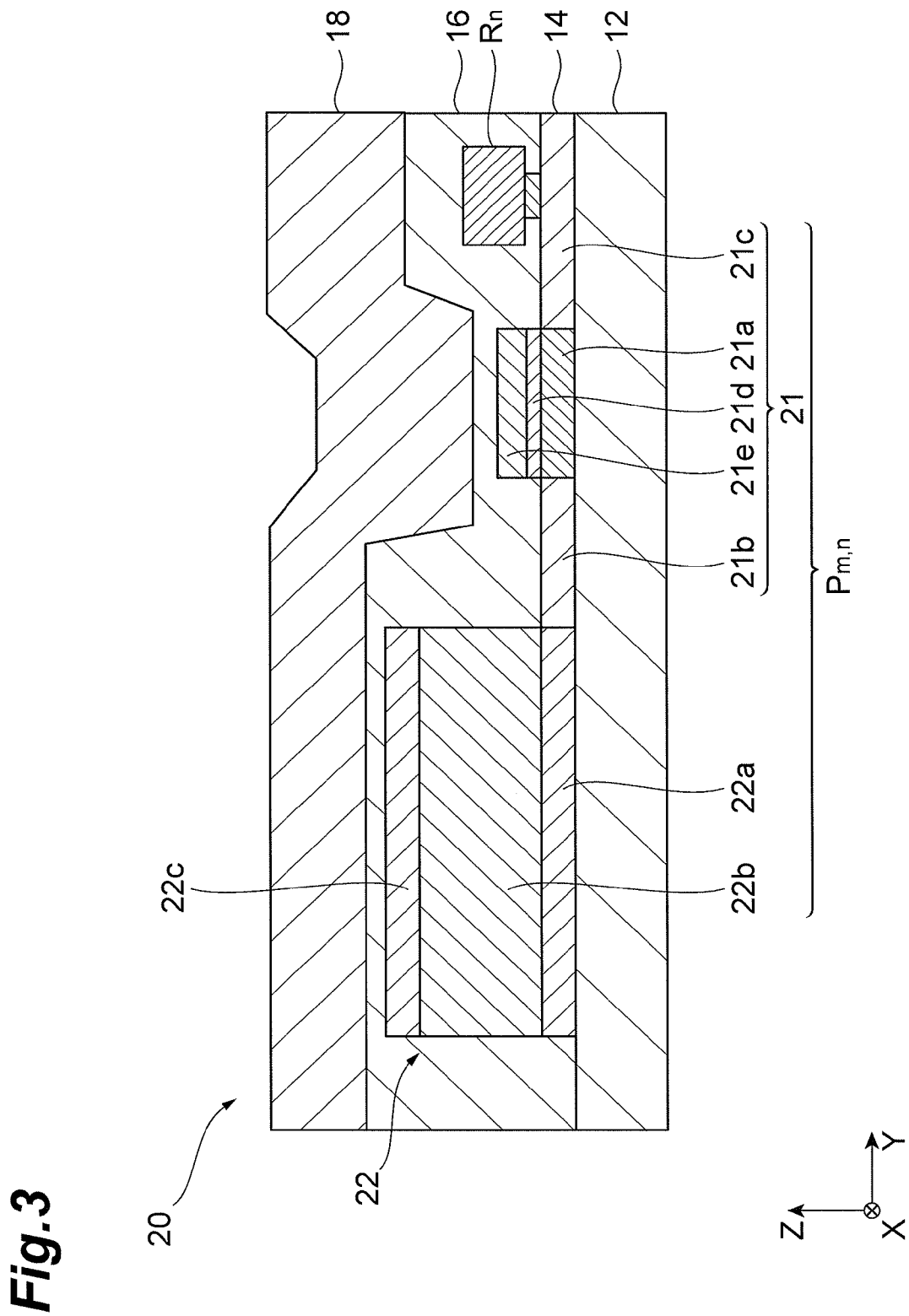
FIG. 3 is a side sectional view showing a section taken along a line I-I of FIG. 2.

The solid-state imaging element to be used in the following respective embodiments is used for, for example, a medical X-ray imaging system, and used particularly for a system for taking X-ray images of the jaw of a subject being tested by imaging modes such as panoramic radiography, cephalography, and CT in dentistry medical treatment. Therefore, the solid-state imaging element according to the following respective embodiments includes thin-film transistors formed by polycrystalline silicon deposited on a large-area glass substrate and photodiodes formed by amorphous silicon deposited thereon, and has a remarkably wide photodetecting area as compared with that of a conventional solid-state imaging element prepared from a monocrystalline silicon wafer. FIG. 1 to FIG. 3 are views showing a configuration of a solid-state imaging device 10 as an example of a device for realizing the control method according to the respective embodiments to be described below. FIG. 1 is a plan view showing the solid-state imaging device 10, and FIG. 2 is a partially enlarged plan view of the solid-state imaging device 10. Further, FIG. 3 is a side sectional view showing a section taken along a line I-I of FIG. 2. Also, in FIG. 1 to FIG. 3, an XYZ orthogonal coordinate system is also shown for easy understanding.

As shown in FIG. 1, the solid-state imaging device 10 includes a solid-state imaging element 11. The solid-state imaging element 11 is a control object in the following respective embodiments, and includes a glass substrate 12 and a photodetecting region 20 and a vertical shift register section 30 fabricated on a principal surface of the glass substrate 12. The vertical shift register section 30 is disposed along a lateral side of the photodetecting region 20. Moreover, the solid-state imaging device 10 further includes a signal output section 40 disposed separately from the solid-state imaging element 11. The signal output section 40 is composed of, for example, a plurality of C-MOS IC chips 41 electrically connected with the photodetecting region 20. The signal output section 40 includes N integration circuits provided for each of the N columns of the photodetecting region 20, and these N integration circuits generate voltage values according to the amounts of charges output from the pixels of the first column through the N-th column. The signal output section 40 holds voltage values output from the respective integration circuits, and outputs the held voltage values successively.

Also, the photodetecting region 20 and the vertical shift register section 30 may be respectively provided on separate glass substrates 12. Further, the signal output section 40 may be provided on the glass substrate 12 with the photodetecting region 20 and the vertical shift register section 30.

The photodetecting region 20 is composed of M×N pixels two-dimensionally arrayed in M rows and N columns. The pixel $P_{m,n}$ shown in FIG. 2 is a pixel located on the m-th row and the n-th column. Here, m is an integer not less than 1 and not more than M, and n is an integer not less than 1 and not more than N. M is an integer not less than 3, and N is an integer not less than 2. Also, in FIG. 2, the column direction is coincident with the X-axis direction, and the row direction is coincident with the Y-axis direction. Each of the plurality of pixels $P_{1,1}$ to $P_{M,N}$ included in the photodetecting region 20 includes a transistor 21 serving as a readout switch and a photodiode 22. One current terminal of the transistor 21 is connected to the photodiode 22. Further, the other current terminal of the transistor 21 is connected to a corresponding readout wiring line (for example, in the case of the pixel $P_{m,n}$, an n-th column readout wiring line $R_n$). A control terminal of the transistor 21 is connected to a corresponding row selection wiring line (for example, in the case of the pixel $P_{m,n}$, an m-th row selection wiring line $Q_m$).

As shown in FIG. 3, over the entire surface on the glass substrate 12, a polycrystalline silicon film 14 is provided. The transistor 21, the photodiode 22, and the n-th column readout wiring line $R_n$ are formed on the surface of the polycrystalline silicon film 14. The transistor 21, the photodiode 22, and the n-th column readout wiring line $R_n$ are covered with an insulating layer 16, and on the insulating layer 16, a scintillator 18 is provided so as to cover the entire surface of the glass substrate 12. The scintillator 18 generates scintillation light in response to incident X-rays to convert an X-ray image into an optical image, and outputs the optical image to the photodetecting region 20. The n-th column readout wiring line $R_n$ is made of metal.

The photodiode 22 generates charge of an amount according to an incident light intensity, and accumulates the generated charge in a junction capacitance section. The photodiode 22 is a PIN photodiode including an n-type semiconductor layer 22a, an i-type semiconductor layer 22b, and a p-type semiconductor layer 22c. The n-type semiconductor layer 22a is a semiconductor layer made of n-type polycrystalline silicon. The i-type semiconductor layer 22b is a semiconductor layer made of i-type (undoped) amorphous silicon, and provided on the n-type semiconductor layer 22a. Thus, as a result of the i-type semiconductor layer 22b being formed of amorphous silicon, the i-type semiconductor layer 22b can be made thick, so that the photoelectric conversion efficiency of the photodiode 22 can be increased to improve the sensitivity of the solid-state imaging device 10. The p-type semiconductor layer 22c is a semiconductor layer made of p-type amorphous silicon, and provided on the i-type semiconductor layer 22b.

The transistor 21 is preferably constructed by a field effect transistor (FET), but may be constructed by a bipolar transistor. When the transistor 21 is an FET, the control terminal means a gate and the current terminal means a source or drain in the following description. The transistor 21 shown in FIG. 3 has an FET configuration, and includes a region made of polycrystalline silicon. For example, the transistor 21 includes a channel region 21a, a source region 21b, and a drain region 21c, each of which is made of polycrystalline silicon. The source region 21b is formed along one side surface of the channel region 21a. The drain region 21c is formed along the other side surface of the channel region 21a. Moreover, there is provided a gate electrode 21e on the channel region 21a, and there is interposed a gate insulating film 21d between the gate electrode 21e and the channel region 21a.

The polycrystalline silicon that forms the channel region 21a, the source region 21b, and the drain region 21c of the transistor 21 is more preferably low-temperature polycrystalline silicon (LTPS; Low Temperature Polycrystalline Silicon). The low-temperature polycrystalline silicon is polycrystalline silicon that is deposited at a relatively-low process temperature of 100 to 600° C. Under such a low temperature, because a glass substrate 12 such as, for example, alkali-free glass can be used as a support substrate, setting the forming material of the above-mentioned respective regions 21a, 21b, and 21c as low-temperature polycrystalline silicon allows using as a support substrate a glass substrate 12 having a large area as compared with a monocrystalline silicon wafer to fabricate a large-area photodetecting region 20 on the glass substrate 12.

In one example, as the material for the glass substrate 12, for example, sheet-like alkali-free glass (for substrate use) having a thickness such as 0.3 mm to 1.2 mm is used. The alkali-free glass contains little alkali, has a low coefficient of expansion and high heat resistance, and has stable characteristics. Moreover, the electron mobility in low-temperature polycrystalline silicon is 10 to 600 cm$^2$/Vs, which is greater than the electron mobility (0.3 to 1.0 cm$^2$/Vs) in amorphous silicon, and therefore, forming the regions 21a, 21b, and 21c of the transistor 21 by low-temperature polycrystalline silicon allows lowering the on-resistance of the transistor 21.

The pixel $P_{m,n}$ as shown in FIG. 3 is fabricated, for example, by the following process. First, an amorphous silicon film is formed on the glass substrate 12. As the film forming method, for example, plasma CVD is favorable. Next, by sequentially irradiating the whole of the amorphous silicon film with laser beams (for example, excimer laser beams), the entire surface of the amorphous silicon film is made into polycrystalline silicon (excimer laser annealing). Thus, a polycrystalline silicon film 14 is formed. Then, after a $SiO_2$ film to serve as a gate insulating film 21d is formed on a partial region of the polycrystalline silicon film 14, a gate electrode 21e is formed thereon. Then, ions are implanted into respective regions to be the source region 21b and the drain region 21c. Subsequently, by carrying out patterning of the polycrystalline silicon film 14, exposure and etching are repeatedly carried out to form other electrodes and contact holes, etc. Moreover, after ions are implanted into a region to be the pixel $P_{m,n}$ in the polycrystalline silicon film 14 so as to become n-type, i-type and p-type amorphous silicon layers (i.e. an i-type semiconductor layer 22b and a p-type semiconductor layer 22c) are deposited thereon in order to form a PIN photodiode 22. Subsequently, a passivation film to serve as the insulating layer 16 is formed.

Figure 4:
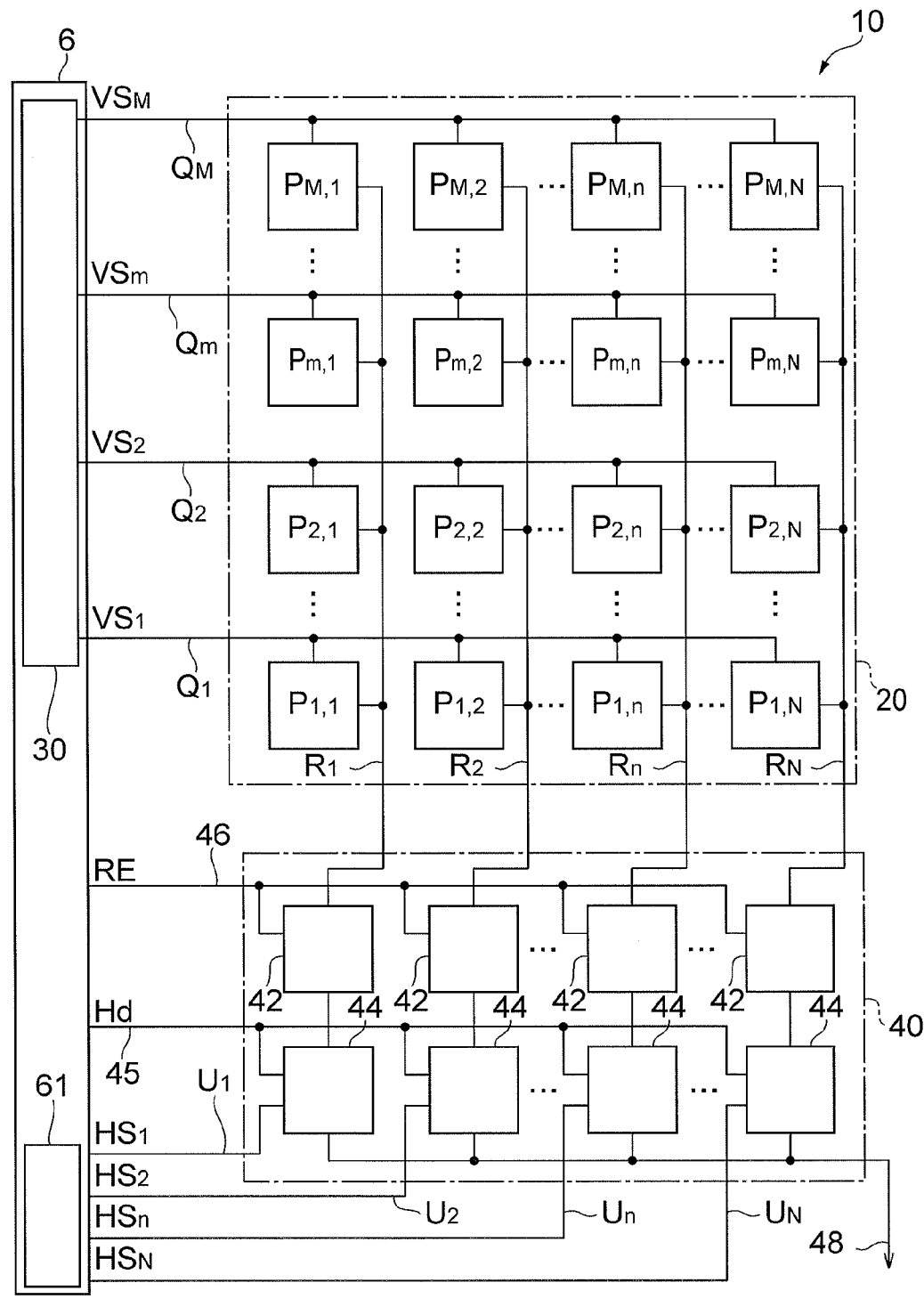
FIG. 4 is a diagram showing an internal configuration of the solid-state imaging device.

Next, a circuit configuration of the solid-state imaging device 10 will be described in detail. FIG. 4 is a diagram showing an internal configuration of the solid-state imaging device 10. As in the above, the photodetecting region 20 consists of M×N pixels $P_{1,1}$ to $P_{M,N}$ arrayed two-dimensionally in M rows and N columns. The N pixels $P_{m,1}$ to $P_{m,N}$ of the m-th row are connected to the vertical shift register section 30 via the m-th row selection wiring line $Q_m$. Also, in FIG. 4, the vertical shift register section 30 is included in a controlling section 6.

The signal output section 40 includes N integration circuits 42 and N holding circuits 44 provided for each column. The integration circuits 42 and the holding circuits 44 are connected in series with each other for each column. The N integration circuits 42 have a common configuration with each other. Moreover, the N holding circuits 44 have a common configuration with each other.

Each of the N integration circuits 42 has an input terminal connected to each of the readout wiring lines $R_1$ to $R_N$, and accumulates a charge input to the input terminal from each of the readout wiring lines $R_1$ to $R_N$, and outputs a voltage value according to the accumulated charge amount from an output terminal to each of the N holding circuits 44. Each of the N integration circuits 42 is connected to the controlling section 6 via a reset wiring line 46 provided in common for the N integration circuits 42. Each of the N holding circuits 44 has an input terminal connected to the output terminal of the integration circuit 42, holds a voltage value input to the input terminal, and outputs the held voltage value from an output terminal to a voltage output wiring line 48. Each of the N holding circuits 44 is connected to the controlling section 6 via a hold wiring line 45 provided in common for the N holding circuits 44. Moreover, each of the N holding circuits 44 is connected to a horizontal shift register section 61 of the controlling section 6 via each of the first column selection wiring line $U_1$ to the N-th column selection wiring line $U_N$.

The vertical shift register section 30 of the controlling section 6 provides an m-th row selection control signal $VS_m$ to each of the N pixels $P_{m,1}$ to $P_{m,N}$ of the m-th row via the m-th row selection wiring line $Q_m$. In the vertical shift register section 30, row selection control signals $VS_1$ to $VS_m$ sequentially take significant values. Moreover, the horizontal shift register section 61 of the controlling section 6 provides column selection control signals $HS_1$ to $HS_N$ to the respective N holding circuits 44 via the column selection wiring lines $U_1$ to $U_N$. In the horizontal shift register section 61, the column selection control signals $HS_1$ to $HS_N$ sequentially take significant values. Moreover, the controlling section 6 provides a reset control signal RE to each of the N integration circuits 42 via the reset wiring line 46, and provides a hold control signal Hd to each of the N holding circuits 44 via the hold wiring line 45.

Figure 5:
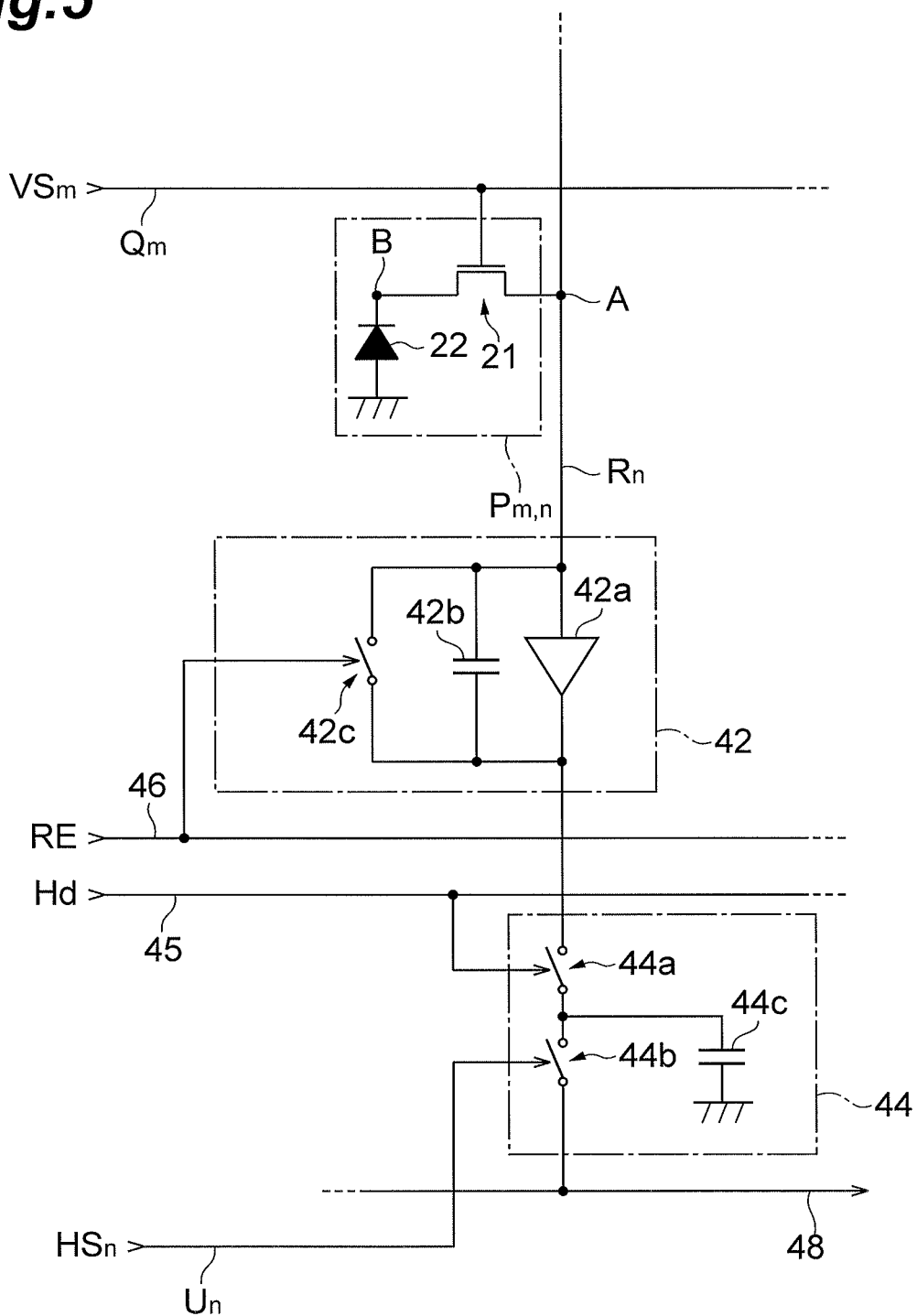
FIG. 5 is a diagram showing an example of a circuit configuration of each of the pixel, integration circuit, and holding circuit of the solid-state imaging device.

FIG. 5 is a diagram showing an example of a circuit configuration of each of the pixel $P_{m,n}$, integration circuit 42, and holding circuit 44 of the solid-state imaging device 10. Here, a circuit diagram of the pixel $P_{m,n}$ is shown as a representative of the M×N pixels $P_{1,1}$ to $P_{M,N}$.

As shown in FIG. 5, the anode terminal of the photodiode 22 of the pixel $P_{m,n}$ is grounded, and the cathode terminal is connected to the readout wiring line $R_n$ via the transistor 21. The transistor 21 of the pixel $P_{m,n}$ is provided with an m-th row selection control signal $VS_m$ via the m-th row selection wiring line $Q_m$ from the vertical shift register section 30. The m-th row selection control signal $VS_m$ instructs an opening and closing operation of the transistor 21 included in each of the N pixels $P_{m,1}$ to $P_{m,N}$ of the m-th row. For example, when the m-th row selection control signal $VS_m$ has a non-significant value (for example, low level), the transistor 21 reaches a non-connected state. At this time, a charge generated in the photodiode 22 is not output to the column readout wiring line $R_n$, but is accumulated in the junction capacitance section of the photodiode 22. On the other hand, when the m-th row selection control signal $VS_m$ has a significant value (for example, high level), the transistor 21 reaches a connected state. At this time, the charge that has been accumulated in the junction capacitance section of the photodiode 22 is output to the readout wiring line $R_n$ through the transistor 21. This charge is sent to the integration circuit 42 via the readout wiring line $R_n$.

The integration circuit 42 includes an amplifier 42a, a capacitive element 42b, and a discharge switch 42c. The capacitive element 42b and the discharge switch 42c are connected in parallel with each other, and connected between an input terminal and an output terminal of the amplifier 42a. The input terminal of the amplifier 42a is connected with the readout wiring line $R_n$. The discharge switch 42c is provided with a reset control signal RE via the reset wiring line 46 from the controlling section 6.

The reset control signal RE instructs an opening and closing operation of the discharge switch 42c in each of the N integration circuits 42. For example, when the reset control signal RE has a non-significant value (for example, high level), the discharge switch 42c closes, the capacitive element 42b is discharged, and an output voltage value of the integration circuit 42 is initialized. On the other hand, when the reset control signal RE has a significant value (for example, low level), the discharge switch 42c opens, a charge input to the integration circuit 42 is accumulated in the capacitive element 42b, and a voltage value according to the accumulated charge amount is output from the integration circuit 42.

The holding circuit 44 includes an input switch 44a, an output switch 44b, and a capacitive element 44c. One end of the capacitive element 44c is grounded. The other end of the capacitive element 44c is connected to the output terminal of the integration circuit 42 via the input switch 44a, and connected with the voltage output wiring line 48 via the output switch 44b. The input switch 44a is provided with a hold control signal Hd via the hold wiring line 45 from the controlling section 6. The hold control signal Hd instructs an opening and closing operation of the input switch 44a in each of the N holding circuits 44. The output switch 44b of the holding circuit 44 is provided with an n-th column selection control signal $HS_n$ passed through the n-th column selection wiring line $U_n$ from the controlling section 6. The selection control signal $HS_n$ instructs an opening and closing operation of the output switch 44b of the holding circuit 44.

For example, when the hold control signal Hd switches from high level to low level, the input switch 44a switches from a closed state to an open state, and a voltage value being input to the holding circuit 44 at this time is held in the capacitive element 44c. Moreover, when the n-th column selection control signal $HS_n$ switches from low level to high level, the output switch 44b closes, and the voltage value held in the capacitive element 44c is output to the voltage output wiring line 48.

First Embodiment

Figure 6:
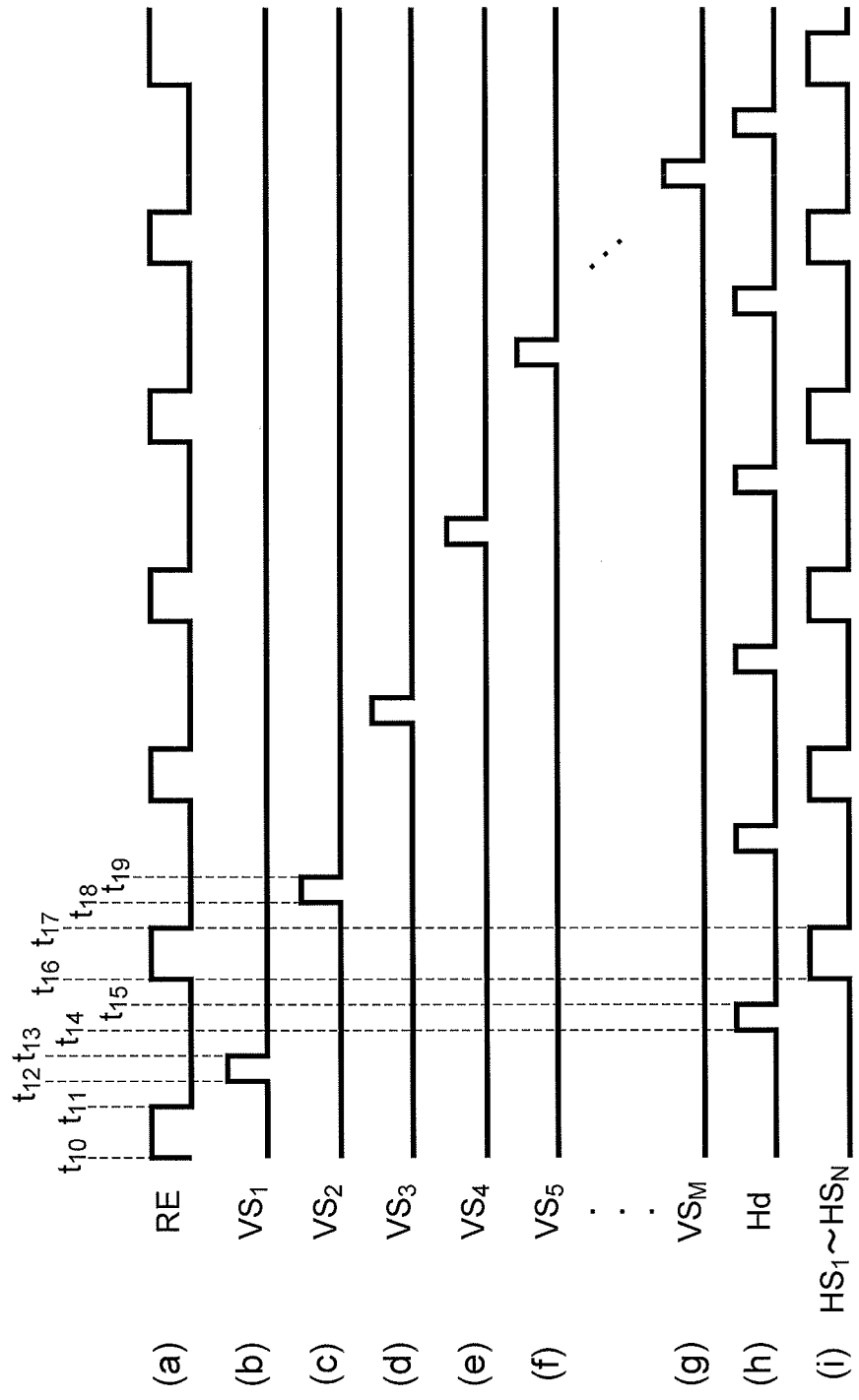
FIG. 6 is a timing chart of respective signals to be applied to a solid-state imaging element in a control method for a solid-state imaging element according to a first embodiment, and shows a mode (a normal readout mode) for reading out charges from all pixels in a photodetecting region.
Figure 7:
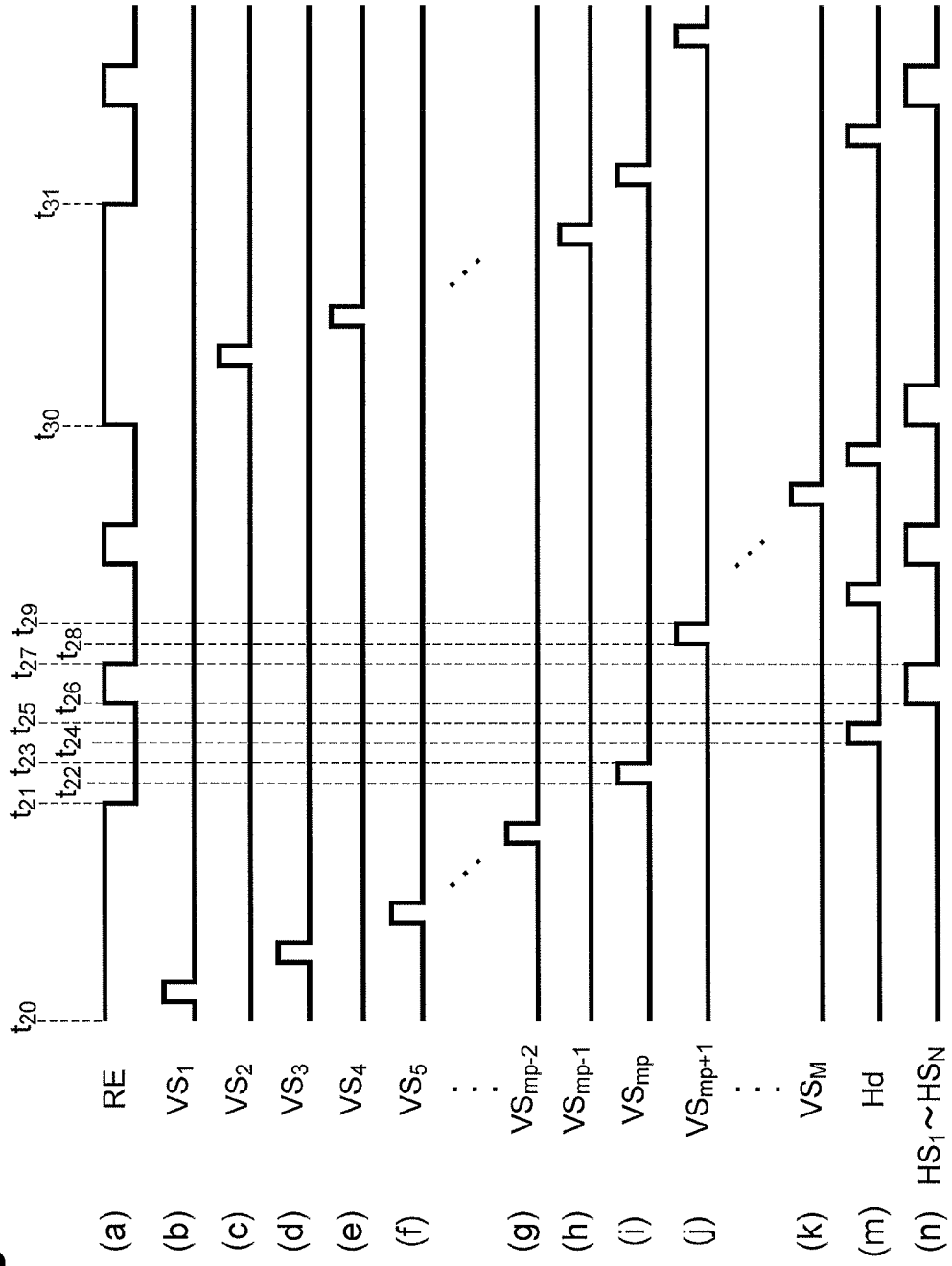
FIG. 7 is a timing chart of respective signals to be applied to a solid-state imaging element in a control method for a solid-state imaging element according to a first embodiment, and shows a mode (a partial readout mode) for reading out charges from only pixels in a partial region (an interest region) of a photodetecting region.

FIG. 6 and FIG. 7 are timing charts of respective signals to be applied to the solid-state imaging element 11 in a control method for a solid-state imaging element according to a first embodiment. FIG. 6 shows a mode (a normal readout mode) for reading out charges from all pixels in the photodetecting region 20. Moreover, FIG. 7 shows a mode (a partial readout mode) for reading out charges from only pixels in a partial region (an interest region) of the photodetecting region 20.

Also, FIG. 6 shows, in order from the top, (a) the reset control signal RE, (b) the first row selection control signal $VS_1$, (c) the second row selection control signal $VS_2$, (d) the third row selection control signal $VS_3$, (e) the fourth row selection control signal $VS_4$, (f) the fifth row selection control signal $VS_5$, (g) the M-th row selection control signal $VS_M$, (h) the hold control signal Hd, and (i) the first column selection control signal $HS_1$ to the N-th column selection control signal $HS_N$, respectively. FIG. 7 shows, in order from the top, (a) the reset control signal RE, (b) the first row selection control signal $VS_1$, (c) the second row selection control signal $VS_2$, (d) the third row selection control signal $VS_3$, (e) the fourth row selection control signal $VS_4$, (f) the fifth row selection control signal $VS_5$, (g) the (mp−2)-th row selection control signal $VS_{mp-2}$, (h) the (mp−1)-th row selection control signal $VS_{mp-1}$, (i) the mp-th row selection control signal $VS_{mp}$, (j) the (mp+1)-th row selection control signal $VS_{mp+1}$, (k) the M-th row selection control signal $VS_M$, (m) the hold control signal Hd, and (n) the first column selection control signal $HS_1$ to the N-th column selection control signal $HS_N$, respectively.

<First Control Method (Normal Readout Mode)>

In the first control method (normal readout mode), charges accumulated in all pixels $P_{1,1}$ to $P_{M,N}$ of the photodetecting region 20 are read out. As shown in FIG. 6, first, during a period from the time $t_{10}$ to the time $t_{11}$, the controlling section 6 makes the reset control signal RE high level. Accordingly, in each of the N integration circuits 42, the discharge switch 42c reaches a closed state, and the capacitive element 42b is discharged.

During a period from the time $t_{12}$ to the time $t_{13}$ after the time $t_{11}$, the controlling section 6 makes the first row selection control signal $VS_1$ high level. Accordingly, the transistors 21 reach a connected state in the pixels $P_{1,1}$ to $P_{1,N}$ of the first row, charges accumulated in the photodiodes 22 of the respective pixels $P_{1,1}$ to $P_{1,N}$ are output to the integration circuits 42 through the readout wiring lines $R_1$ to $R_N$, and accumulated in the capacitive elements 42b. From the integration circuits 42, voltage values of the magnitudes according to the amounts of charges accumulated in the capacitive elements 42b are output. Also, after the time $t_{13}$, the transistor 21 in each of the pixels $P_{1,1}$ to $P_{1,N}$ of the first row is brought into a nonconnected state.

Then, during a period from the time $t_{14}$ to the time $t_{15}$ after the time $t_{13}$, the controlling section 6 makes the hold control signal Hd high level, and accordingly, the input switch 44a reaches a connected state in each of the N holding circuits 44, and a voltage value output from the integration circuit 42 is held by the capacitive element 44c.

Then, during a period from the time $t_{16}$ to the time $t_{17}$ after the time $t_{15}$, the controlling section 6 makes the first column selection control signal $HS_1$ to the N-th column selection control signal $HS_N$ sequentially high level. Accordingly, the output switches 44b of the N holding circuits 44 sequentially reach a closed state, and the voltage values that have been held in the capacitive elements 44c are successively output to the voltage output wiring line 48. Moreover, during this period, the controlling section 6 makes the reset control signal RE high level, and the capacitive element 42b of the integration circuit 42 is discharged.

Then, during a period from the time $t_{18}$ to the time $t_{19}$ after the time $t_{17}$, the controlling section 6 makes the second row selection control signal $VS_2$ high level. Accordingly, the transistors 21 reach a connected state in the pixels $P_{2,1}$ to $P_{2,N}$ of the second row, charges accumulated in the photodiodes 22 of the respective pixels $P_{2,1}$ to $P_{2,N}$ are output to the integration circuits 42 through the readout wiring lines $R_1$ to $R_N$, and accumulated in the capacitive elements 42b. Thereafter, by the same operation as with the first row, voltage values of the magnitudes according to the amounts of charges accumulated in the capacitive elements 42b are successively output from the N holding circuits 44 to the voltage output wiring line 48. And, charges accumulated in the pixels of the third row through the M-th row are also converted into voltage values by the same operation as with the first row, and are successively output to the voltage output wiring line 48. Thus, readout of one imaging frame of image data from the photodetecting region 20 is completed.

<Second Control Method (Partial Readout Mode)>

In the second control method (partial readout mode), charges accumulated in a part of the pixels $P_{1,1}$ to $P_{M,N}$ of the photodetecting region 20, that is, pixels $P_{mp,1}$ to $P_{M,N}$ contained in the mp-th row to the M-th row that are readout object rows (provided that here, mp is an odd number not less than 3 and not more than (M−1)), are read out, and for charges accumulated in pixels $P_{1,1}$ to $P_{mp-1,N}$ contained in the remaining first row to (mp−1)-th row that are non-readout object rows, a removing processing (resetting) is performed.

As shown in FIG. 7, first, during a period from the time $t_{20}$ to the time $t_{21}$, the controlling section 6 makes the reset control signal RE high level. Accordingly, in each of the N integration circuits 42, the discharge switch 42c reaches a closed state. Moreover, in this period from the time $t_{20}$ to the time $t_{21}$, the controlling section 6 makes, of the first row to the (mp−1)-th row that are non-readout object rows, odd numbered rows, that is, the first row selection control signal $VS_1$, the third row selection control signal $VS_3$, ..., the (mp−2)-th row selection control signal $VS_{mp-2}$, successively high level. Accordingly, the following operation is performed successively in the odd numbered rows of the (mp−1) non-readout object rows. That is, the transistors 21 sequentially reach a connected state in the respective pixels contained in the rows, and charges accumulated in the photodiodes 22 are output to the integration circuits 42 through the readout wiring lines $R_1$ to $R_N$. During this period, because the discharge switches 42c of the integration circuits 42 are always in a closed state, charges that have reached the integration circuits 42 are removed to a reference potential line (GND line). By such operation, the photodiodes 22 of the pixels contained in the odd numbered rows of the (mp−1) non-readout object rows are reset.

Then, during a period from the time $t_{22}$ to the time $t_{23}$ after the time $t_{21}$, the controlling section 6 makes the mp-th row selection control signal $VS_{mp}$ high level. Accordingly, the transistors 21 reach a connected state in the pixels $P_{mp,1}$ to $P_{mp,N}$ of the mp-th row, charges accumulated in the photodiodes 22 of the respective pixels $P_{mp,1}$ to $P_{mp,N}$ are output to the integration circuits 42 through the readout wiring lines $R_1$ to $R_N$, and accumulated in the capacitive elements 42b. From the integration circuits 42, voltage values of the magnitudes according to the amounts of charges accumulated in the capacitive elements 42b are output. Also, after the time $t_{23}$, the transistor 21 in each of the pixels $P_{mp,1}$ to $P_{mp,N}$ of the mp-th row is brought into a non-connected state.

Then, during a period from the time $t_{24}$ to the time $t_{25}$ after the time $t_{23}$, the controlling section 6 makes the hold control signal Hd high level. Accordingly, a voltage value output from the integration circuit 42 is held by the capacitive element 44c.

Then, during a period from the time $t_{26}$ to the time $t_{27}$ after the time $t_{25}$, the controlling section 6 makes the first column selection control signal $HS_1$ to the N-th column selection control signal $HS_N$ sequentially high level. Accordingly, the voltage values that have been held in the capacitive elements 44c are successively output to the voltage output wiring line 48. Moreover, during this period, the controlling section 6 makes the reset control signal RE high level, and the capacitive element 42b of the integration circuit 42 is discharged.

Then, during a period from the time $t_{28}$ to the time $t_{29}$ after the time $t_{27}$, the controlling section 6 makes the (mp+1)-th row selection control signal $VS_{mp+1}$ high level. Accordingly, the transistors 21 reach a connected state in the pixels $P_{mp+1,1}$ to $P_{mp+1,N}$ of the (mp+1)-th row, charges accumulated in the photodiodes 22 of the respective pixels $P_{mp+1,1}$ to $P_{mp+1,N}$ are output to the integration circuits 42 through the readout wiring lines $R_1$ to $R_N$, and accumulated in the capacitive elements 42b. Thereafter, by the same operation as with the mp-th row, voltage values of the magnitudes according to the amounts of charges accumulated in the capacitive elements 42b are successively output from the N holding circuits 44 to the voltage output wiring line 48. And, charges accumulated in the pixels of the (mp+2)-th row through the M-th row are also converted into voltage values by the same operation as with the mp-th row, and are successively output to the voltage output wiring line 48. Thus, readout of one imaging frame of image data from the readout object rows of the photodetecting region 20 is completed.

Then, during a period from the time $t_{30}$ to the time $t_{31}$, the controlling section 6 makes the reset control signal RE high level. Accordingly, in each of the N integration circuits 42, the discharge switch 42c reaches a closed state. Moreover, in this period from the time $t_{30}$ to the time $t_{31}$, the controlling section 6 makes, of the first row to the (mp−1)-th row that are non-readout object rows, even numbered rows, that is, the second row selection control signal $VS_2$, the fourth row selection control signal $VS_4$, . . . , the (mp−1)-th row selection control signal $VS_{mp-1}$, successively high level. Accordingly, the photodiodes 22 are reset successively in the even numbered rows of the (mp−1) non-readout object rows. Thereafter, the above-described operation from the time $t_{21}$ to the time $t_{29}$ is repeated again. Thus, readout of the next one frame of image data from the readout object rows of the photodetecting region 20 is completed.

Figure 8:
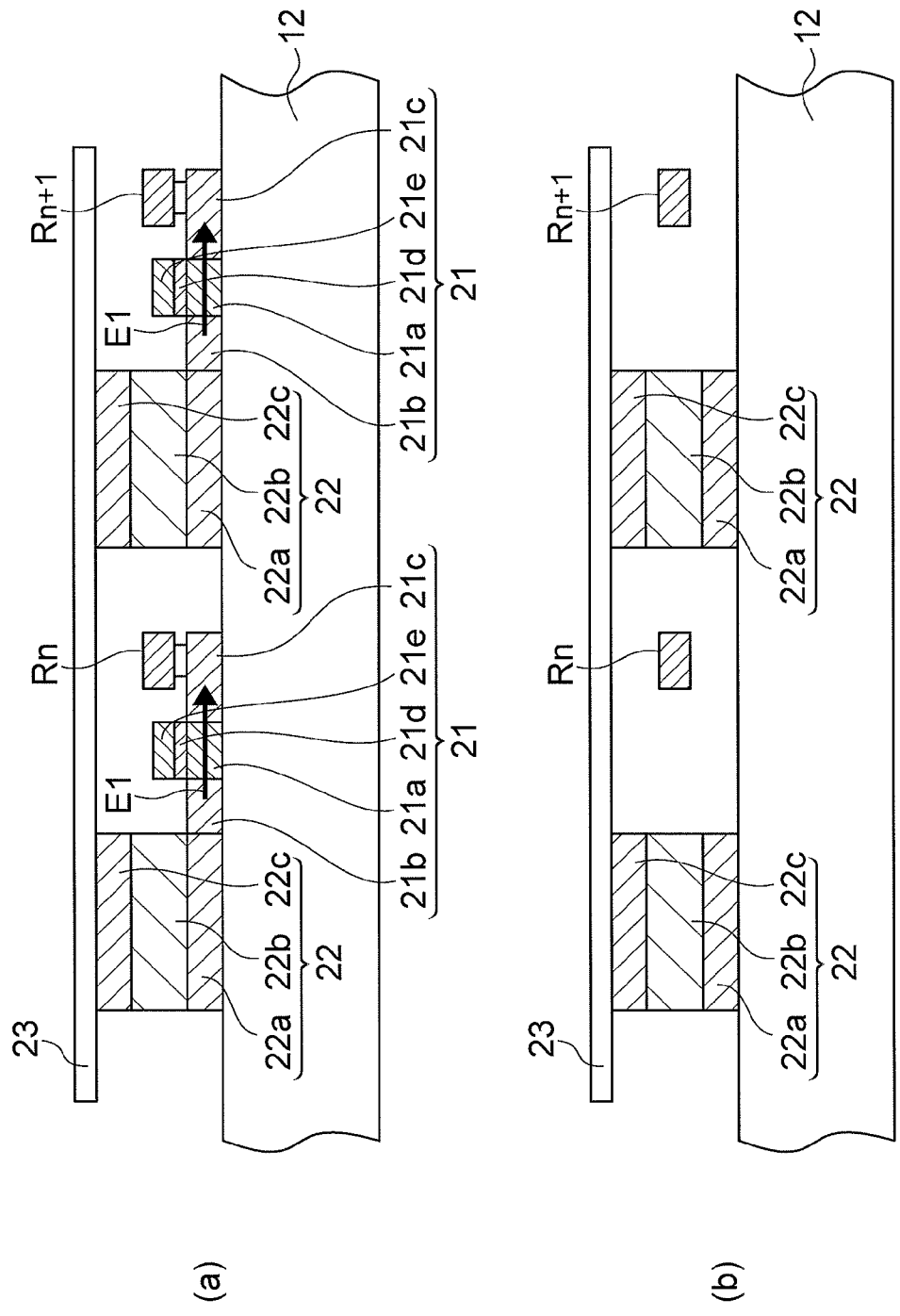
FIG. 8 includes views for explaining an overflow state, in which (a) is a schematic view showing a section of a photodetecting region cut along a cutting plane including transistors, and (b) is a schematic view showing a section of a photodetecting region cut along a cutting plane not including transistors.

Hereinafter, effects to be obtained by the control method for a solid-state imaging element according to the present embodiment will be described. In the case of partially reading out from an imaging region, in a region (non-readout object rows) where charges are not read out, charges are continuously accumulated in the photodiodes to cause an overflow. When an overflow occurs, the overflowed charge enters into peripheral pixels to have influence on imaging data of the peripheral pixels. Here, FIG. 8 includes views for explaining an overflow state. (a) in FIG. 8 is a schematic view showing a section of the photodetecting region 20 cut along a cutting plane including transistors 21. Further, (b) in FIG. 8 is a schematic view showing a section of the photodetecting region 20 cut along a cutting plane not including transistors 21. When charge is excessively accumulated in the photodiode 22, the potential of the n-type semiconductor layer 22a of the photodiode 22 declines due to the charge. Then, when the decline in potential of the n-type semiconductor layer 22a exceeds a limit, even if there is no electrical field applied to the gate electrode 21e of the transistor 21, due to a potential difference between the source region 21b and the drain region 21c, the non-connected state cannot be maintained and charge moves through the channel region 21a (the arrow E1 shown in (a) in FIG. 8). And, due to such a charge movement, an overflow to the readout wiring line $R_n$ occurs. Moreover, as shown in (b) in FIG. 8, in a part of the photodiode 22 that is not in contact with the transistor 21, because the n-type semiconductor layer 22a exists independently of surrounding photodiodes 22, charge never moves to the neighboring photodiodes 22. However, in order to apply a bias voltage to the photodiode 22, the p-type semiconductor layer 22c is connected to a transparent reference potential line (GND line) 23. Therefore, it is considered that, when charge is excessively accumulated in the photodiode 22, the potential of the reference potential line 23 varies locally via the p-type semiconductor layer 22c. Also, because the reference potential line 23 has a significant resistance value, it is considered that such a potential variation occurs only in the vicinity of the pixel concerned.

Figure 9:
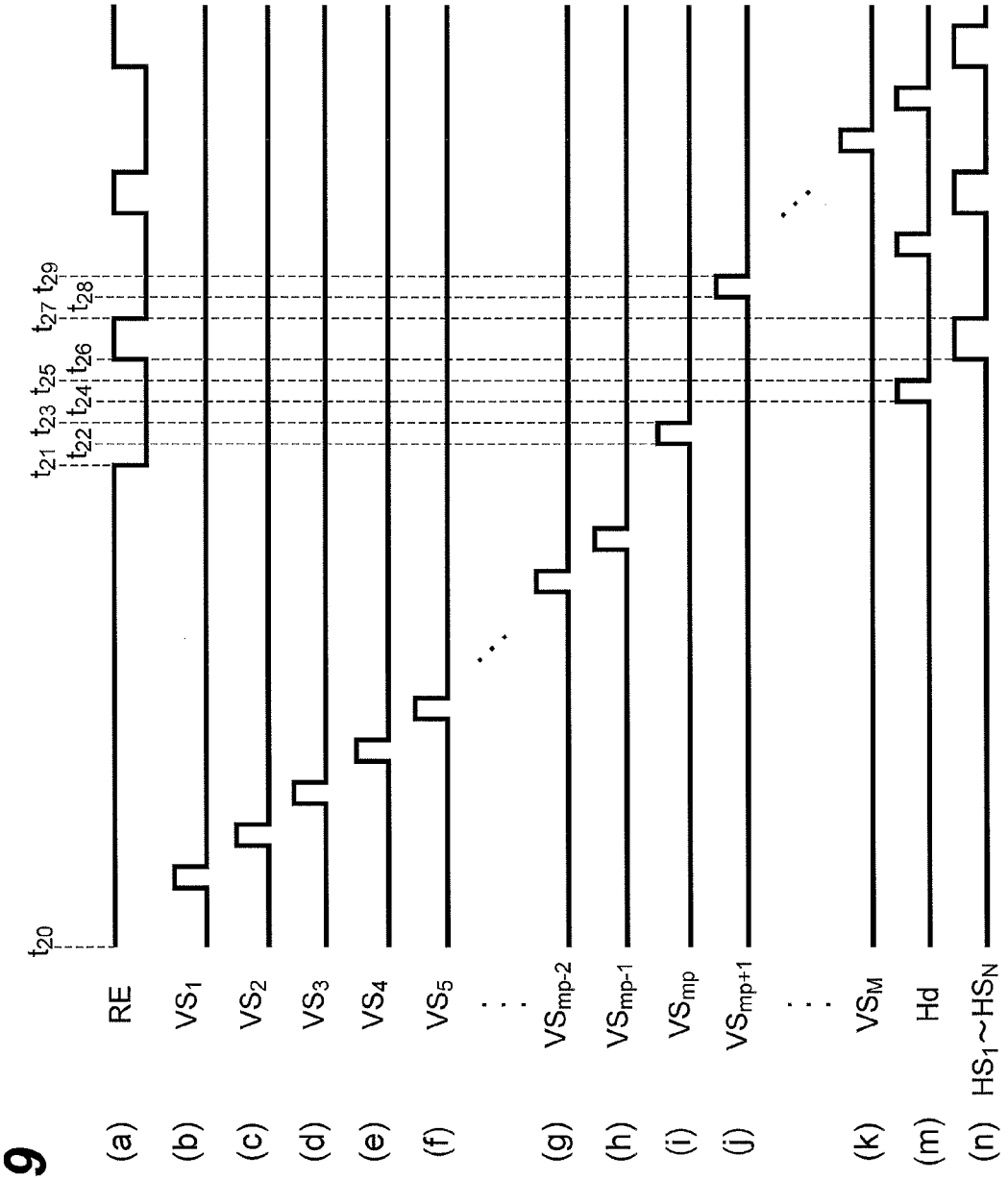
FIG. 9 is a timing chart showing an example of a control method for a solid-state imaging element, including a process for resetting charges of photodiodes included in non-readout object rows.

In order to avoid such an overflow and the like as above, it becomes necessary to appropriately remove (reset) charges of the photodiodes 22 included in the non-readout object rows. Here, FIG. 9 is a timing chart showing an example of a control method for a solid-state imaging element, including a process for resetting charges of the photodiodes 22 included in non-readout object rows. Also, in FIG. 9, the respective signals shown in (a) to (n) are the same as those of FIG. 7 in the foregoing. In this example, in the period from the time $t_{20}$ to the time $t_{21}$ during which the controlling section 6 makes the reset control signal RE high level, the controlling section makes the first row selection control signal $VS_1$, the second row selection control signal $VS_2$, . . . , the (mp−1)-th row selection control signal $VS_{mp-1}$ corresponding to the first row to the (mp−1)-th row that are non-readout object rows successively high level. Accordingly, in all of the (mp−1) non-readout object rows, the photodiodes 22 are successively reset. Thereafter, by similarly performing the operation from the time $t_{22}$ to the time $t_{29}$ shown in FIG. 7, readout of one imaging frame of image data from the readout object rows of the photodetecting region 20 is completed.

For control of the solid-state imaging element 11, it is demanded to reduce the time required per one imaging frame (frame rate) as much as possible. However, in the above-described example, the photodiodes 22 of all non-readout object rows are sequentially reset in one imaging frame, there is a problem that the required time for the respective imaging frames is prolonged. In particular, the larger the area of the photodetecting region 20 and the larger the number of pixels to compose the photodetecting region 20, the longer time is required for resetting the photodiodes 22 of the non-readout object rows, and the required time for imaging frames is further prolonged.

To cope with the problems of the above-described control method, in the second control method (partial readout mode) of the control method for a solid-state imaging element according to the present embodiment, a removing processing (resetting) is performed for only a part of the two or more non-readout object rows (the first row to the (mp−1)-th row) in each of the two times of imaging frames. Specifically, resetting of charges accumulated in pixels contained in the odd numbered non-readout object rows (the first row, the third row, . . . , the (mp−2)-th row) is performed in one imaging frame, and resetting of charges accumulated in pixels contained in the even numbered non-readout object rows (the second row, the fourth row, . . . , the (mp−1)-th row) is performed in the next imaging frame. By such an operation, resetting of charges accumulated in pixels is always performed at least once in the period of two times of imaging frames for each of the two or more non-readout object rows.

According to the inventor's findings, it is not always necessary for avoiding an overflow and the like from pixels of non-readout object rows to reset pixels of all non-readout object rows for every imaging frame. Therefore, as in the control method according to the present embodiment, by alternating resetting the odd numbered and even numbered non-readout object rows in the respective imaging frames so that each of the pixels of the non-readout object rows can be reset once in the period of two times of imaging frames, the time required per one imaging frame can be greatly reduced. In particular, the larger the area of the photodetecting region 20 and the larger the number of pixels $P_{1,1}$ to $P_{M,N}$ to compose the photodetecting region 20, the more this effect becomes prominent.

Moreover, as in the present embodiment, resetting of charges accumulated in the pixels contained in non-readout object rows is preferably successively performed. As described above, by the control method according to the present embodiment, even when resetting of non-readout object rows is successively performed, the time required per one imaging frame can be reduced. And, by successively performing resetting of non-readout object rows, current that flows to the wiring line can be further reduced, and load on the peripheral circuit such as a power supply can be remarkably reduced.

Moreover, in the present embodiment, the non-readout object rows (the first row, the third row, . . . , and the (mp−2)-th row, or the second row, the fourth row, . . . , and the (mp−1)-th row) to be reset in one imaging frame are disposed at intervals of one row from each other. Thus, in the respective imaging frames, the non-readout object rows are preferably spaced from each other at intervals of one or more rows. Accordingly, the positions of non-readout object rows where resetting is performed in the respective imaging frames can be dispersed, and a charge overflow to the readout object rows (the mp-th row to the M-th row) can be more effectively suppressed.

Moreover, in the present embodiment, the channel region 21a, the source region 21b, and the drain region 21c of the transistor 21 are made of polycrystalline silicon. In recent years, for solid-state imaging elements such as two-dimensional flat panel image sensors to be used, for example, for medical purposes (such as dental radiography), wider photodetecting surfaces have been demanded. However, if photodetecting sections are fabricated on monocrystalline silicon wafers as in prior solid-state imaging elements, the extent of photodetecting surfaces of the solid-state imaging elements is limited due to the size of the monocrystalline silicon wafers that are at most 12 inches in diameter. To cope therewith, forming a film of polycrystalline silicon on an insulating substrate such as a glass substrate, and forming photodiodes and other electronic components such as transistors on the surface of the polycrystalline silicon enables making the photodetecting surfaces remarkably wide as compared with those of conventional solid-state imaging elements formed with use of monocrystalline silicon wafers.

Further, in the present embodiment, the channel region 21a, the source region 21b, and the drain region 21c of the transistor 21 may be made of amorphous silicon, and may be made both of polycrystalline silicon and amorphous silicon. Also in this case, the effects described above can be favorably obtained.

However, when the frame rate is high, the transistor 21 made of amorphous silicon has a problem (a so-called memory effect) that a charge is transiently trapped when the transistor is brought into a non-connected state. This is because amorphous silicon is non-crystalline, and therefore results in a high density of levels to trap a charge in FET channels. On the other hand, because polycrystalline silicon (particularly, low-temperature polycrystalline silicon) has a low density of trapping levels, forming the transistor 21 by polycrystalline silicon allows suppressing the occurrence of such a memory effect.

Second Embodiment

Next, a second embodiment concerning a control method for a solid-state imaging element according to the present invention will be described. Also, in the present embodiment, because a first control method (a normal readout mode) is the same as that of the foregoing first embodiment, description thereof will be omitted.

<Second Control Method (Partial Readout Mode)>

Figure 10:
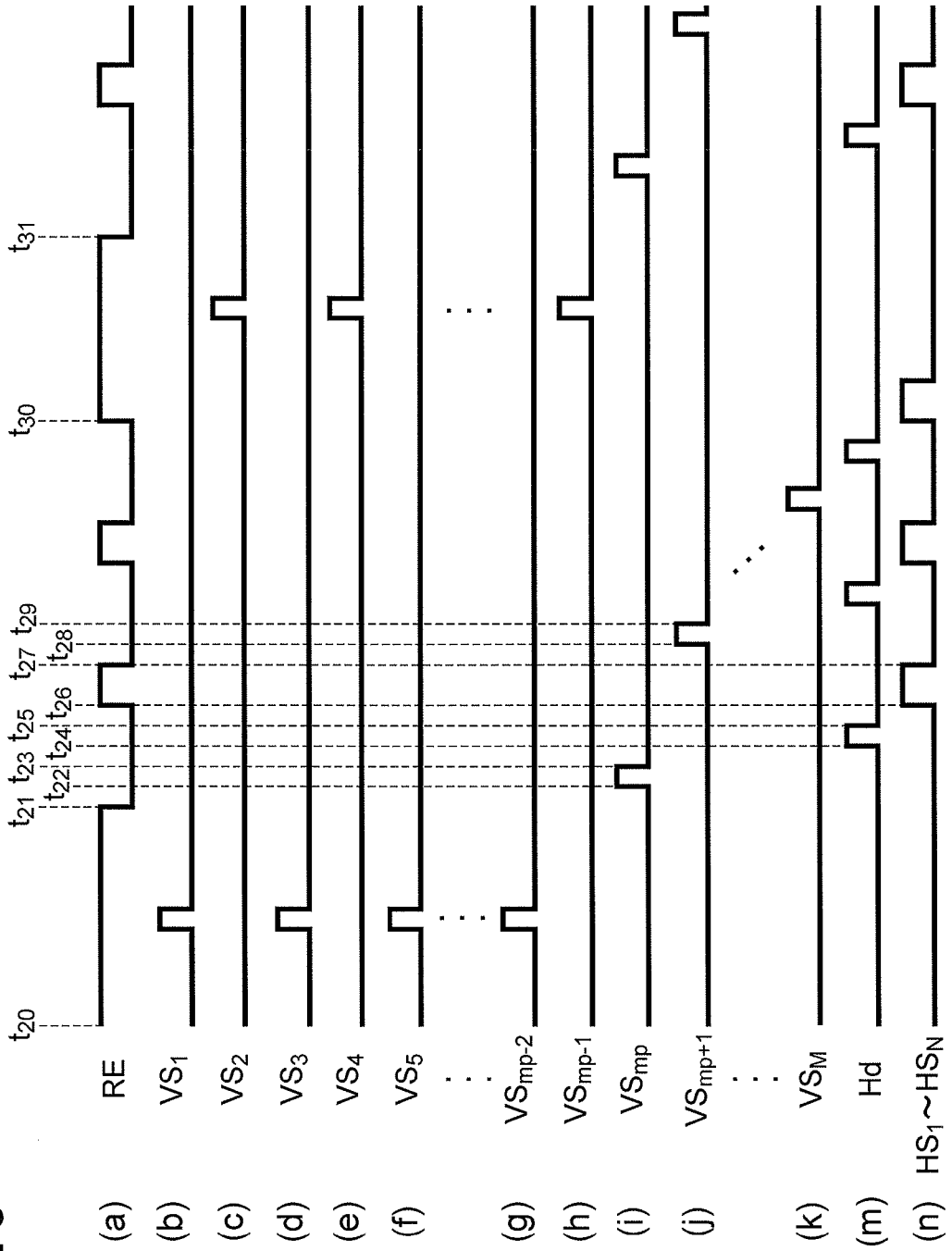
FIG. 10 is a timing chart of respective signals to be applied to a solid-state imaging element in a control method for a solid-state imaging element according to a second embodiment, and shows a mode (a partial readout mode) for reading out charges from only pixels in a partial region (an interest region) of a photodetecting region.

FIG. 10 is a timing chart of respective signals to be applied to the solid-state imaging element 11 in the control method for a solid-state imaging element according to the second embodiment, and shows a mode (a partial readout mode) for reading out charges from only pixels in a partial region (an interest region) of the photodetecting region 20. In (a) to (n) of FIG. 10, respective signals corresponding to (a) to (n) of FIG. 7 of the first embodiment are shown.

Also in the second control method (partial readout mode) according to the present embodiment, in the same manner as with the first embodiment, charges accumulated in a part of the pixels $P_{1,1}$ to $P_{M,N}$ of the photodetecting region 20, that is, pixels $P_{mp,1}$ to $P_{M,N}$ contained in the mp-th row to the M-th row that are readout object rows, are read out, and for charges accumulated in pixels $P_{1,1}$ to $P_{mp-1,N}$ contained in the remaining first row through (mp−1)-th row that are non-readout object rows, a removing processing (resetting) is performed.

First, in the same manner as with the first embodiment, during a period from the time $t_{20}$ to the time $t_{21}$, the controlling section 6 makes the reset control signal RE high level. Accordingly, in each of the N integration circuits 42, the discharge switch 42c reaches a closed state. And, in this period from the time $t_{20}$ to the time $t_{21}$, the controlling section 6 makes, of the first row through the (mp−1)-th row that are non-readout object rows, odd numbered rows, that is, the first row selection control signal $VS_1$, the third row selection control signal $VS_3$, . . . , the (mp−2)-th row selection control signal $VS_{mp-2}$, high level. Here, in the present embodiment, the timing to make these row selection control signals $VS_1$, $VS_3$, . . . , $VS_{mp}-2$ high level is different from that of the first embodiment. These row selection control signals $VS_1$, $VS_3, \ldots, VS_{mp-2}$ were made high level sequentially in the first embodiment, while in the present embodiment, these row selection control signals $VS_1, VS_3, \ldots, VS_{mp-2}$ are made high level simultaneously.

Accordingly, the following operation is performed simultaneously in the odd numbered rows of the (mp−1) non-readout object rows. That is, the transistors 21 all together reach a connected state in the respective pixels contained in these rows, and charges accumulated in the photodiodes 22 are output to the integration circuits 42 through the readout wiring lines $R_1$ to $R_N$. During this period, because the discharge switches 42c of the integration circuits 42 are always in a closed state, charges that have reached the integration circuits 42 are removed to a reference potential line (GND line). By such operation, the photodiodes 22 of the pixels contained in the odd numbered rows of the (mp−1) non-readout object rows are reset.

Then, during a period from the time $t_{22}$ to the time $t_{29}$ after the time $t_{21}$, readout of one imaging frame of image data from the readout object rows (the mp-th row through the M-th row) of the photodetecting region 20 is performed by the same control method as in the first embodiment.

Then, during a period from the time $t_{30}$ to the time $t_{31}$, the controlling section 6 makes the reset control signal RE high level. Accordingly, in each of the N integration circuits 42, the discharge switch 42c reaches a closed state. And, in this period from the time $t_{30}$ to the time $t_{31}$, the controlling section 6 makes, of the first row through the (mp−1)-th row that are non-readout object rows, even numbered rows, that is, the second row selection control signal $VS_2$, the fourth row selection control signal $VS_4, \ldots$, the (mp−1)-th row selection control signal $VS_{mp-1}$, high level. At this time, in the same manner as with the previous imaging frame, these row selection control signals $VS_2, VS_4, \ldots, VS_{mp-1}$ are made high level simultaneously. Accordingly, the photodiodes 22 are reset simultaneously in the even numbered rows of the (mp−1) non-readout object rows. Thereafter, the above-described operation from the time $t_{21}$ to the time $t_{29}$ is repeated again. Thus, readout of the next imaging frame of image data from the readout object rows of the photodetecting region 20 is completed.

Figure 11:
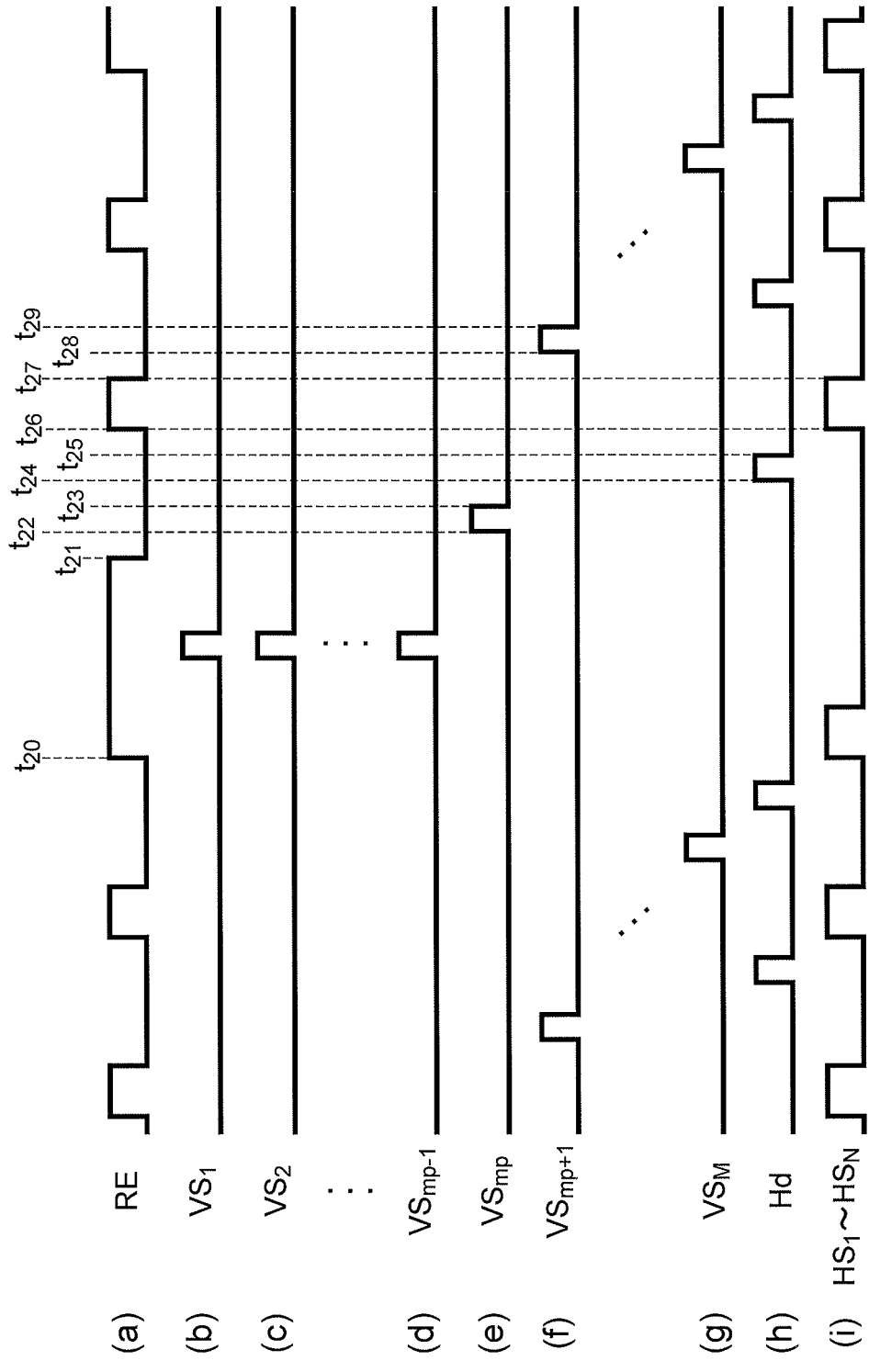
FIG. 11 is a timing chart showing a comparative example of a control method for a solid-state imaging element.

Hereinafter, effects to be obtained by the control method for a solid-state imaging element according to the present embodiment will be described while citing a comparative example. FIG. 11 is a timing chart showing a comparative example of a control method for a solid-state imaging element. As shown in FIG. 11, in this comparative example, in the period from the time $t_{20}$ to the time $t_{21}$ during which the controlling section 6 makes the reset control signal RE high level, the controlling section makes the first row selection control signal $VS_1$, the second row selection control signal $VS_2, \ldots$, the (mp−1)-th row selection control signal $VS_{mp-1}$ corresponding to the first row through the (mp−1)-th row that are non-readout object rows simultaneously high level. Accordingly, in all non-readout object rows, the photodiodes 22 are simultaneously reset. Thereafter, by similarly performing the operation from the time $t_{22}$ to the time $t_{29}$ shown in FIG. 10, readout of one imaging frame of image data from the readout object rows of the photodetecting region 20 is completed.

However, in the above-described comparative example, because the photodiodes 22 of all non-readout object rows are simultaneously reset in one imaging frame, a large current flows to the wiring line connected to the photodiodes 22 at the moment the photodiodes are reset. Therefore, there is a large load on the wiring line and a peripheral circuit such as a power supply.

When described specifically, because the row selection control signals $VS_1$ through $VS_{mp-1}$ corresponding to all non-readout object rows are output all together from the vertical shift register section 30, when the current supply capacity of the power supply is not sufficient, the rising time of the row selection control signals $VS_1$ through $VS_{mp-1}$ is prolonged. Moreover, there is a wiring line to receive a power supply current inside of the vertical shift register section 30, and a power supply current to generate the row selection control signals $VS_1$ through $VS_{mp-1}$ flows to the wiring line at one time, so that the rising time of the row selection control signals $VS_1$ through $VS_{mp-1}$ is further prolonged by a large voltage drop in the wiring line.

Moreover, charges that have been accumulated in the photodiodes 22 of all non-readout object rows are output all together to the respective readout wiring lines $R_1$ to $R_N$, quick resetting of the photodiodes 22 is hindered by a large voltage drop in the readout wiring lines $R_1$ to $R_N$. Further, to the integration circuits 42, because the power supply needs to supply a current to reset the charges output all together from all non-readout object rows, when the current supply capacity of the power supply is low, the time required for a resetting operation of the integration circuits 42 is prolonged. Further, there is also a possibility that the operation of the integration circuits 42 becomes unstable. Moreover, also when the output impedance of the integration circuits 42 is high, the time required for a resetting operation of the integration circuits 42 is prolonged.

And, for avoiding these phenomena caused by simultaneously resetting the photodiodes 22 of all non-readout object rows, a power supply circuit having a sufficient capacity and integration circuits 42 the output impedance of which is sufficiently small are required, which contributes to an increase in manufacturing cost.

To cope with the problems of the comparative example as above, in the second control method (partial readout mode) of the control method for a solid-state imaging element according to the present embodiment, in the same manner as with the foregoing first embodiment, one time of removing processing (resetting) is secured in the period of two times of imaging frames for each of the two or more non-readout object rows (the first row to the (mp−1)-th row), while in the respective imaging frames, resetting of charges accumulated in pixels contained in only a part of the non-readout object rows is performed. Accordingly, current that flows inside of the vertical shift register section 30 and to the readout wiring lines $R_1$ to $R_N$ can be reduced, and load on the peripheral circuit such as a power supply can be reduced.

Moreover, as in the present embodiment, resetting of charges accumulated in pixels contained in non-readout object rows may be simultaneously performed. As described above, by the control method according to the present embodiment, even when resetting of non-readout object rows is simultaneously performed, load on the peripheral circuit can be reduced. And, by simultaneously performing resetting of non-readout object rows, the required time for the respective imaging frames can be further reduced.

Moreover, in the present embodiment, in the same manner as with the first embodiment, the non-readout object rows (the first row, the third row, …, and the (mp−2)-th row, or the second row, the fourth row, …, and the (mp−1)-th row) to be reset in one imaging frame are disposed at intervals of one row from each other. Thus, in the respective imaging frames, the non-readout object rows are preferably spaced from each other at intervals of one or more rows. Accordingly, the positions of non-readout object rows where resetting is performed in the respective imaging frames can be dispersed, and a charge overflow to the readout object rows (the mp-th row to the M-th row) can be more effectively suppressed.

(Modifications)

Figure 12:
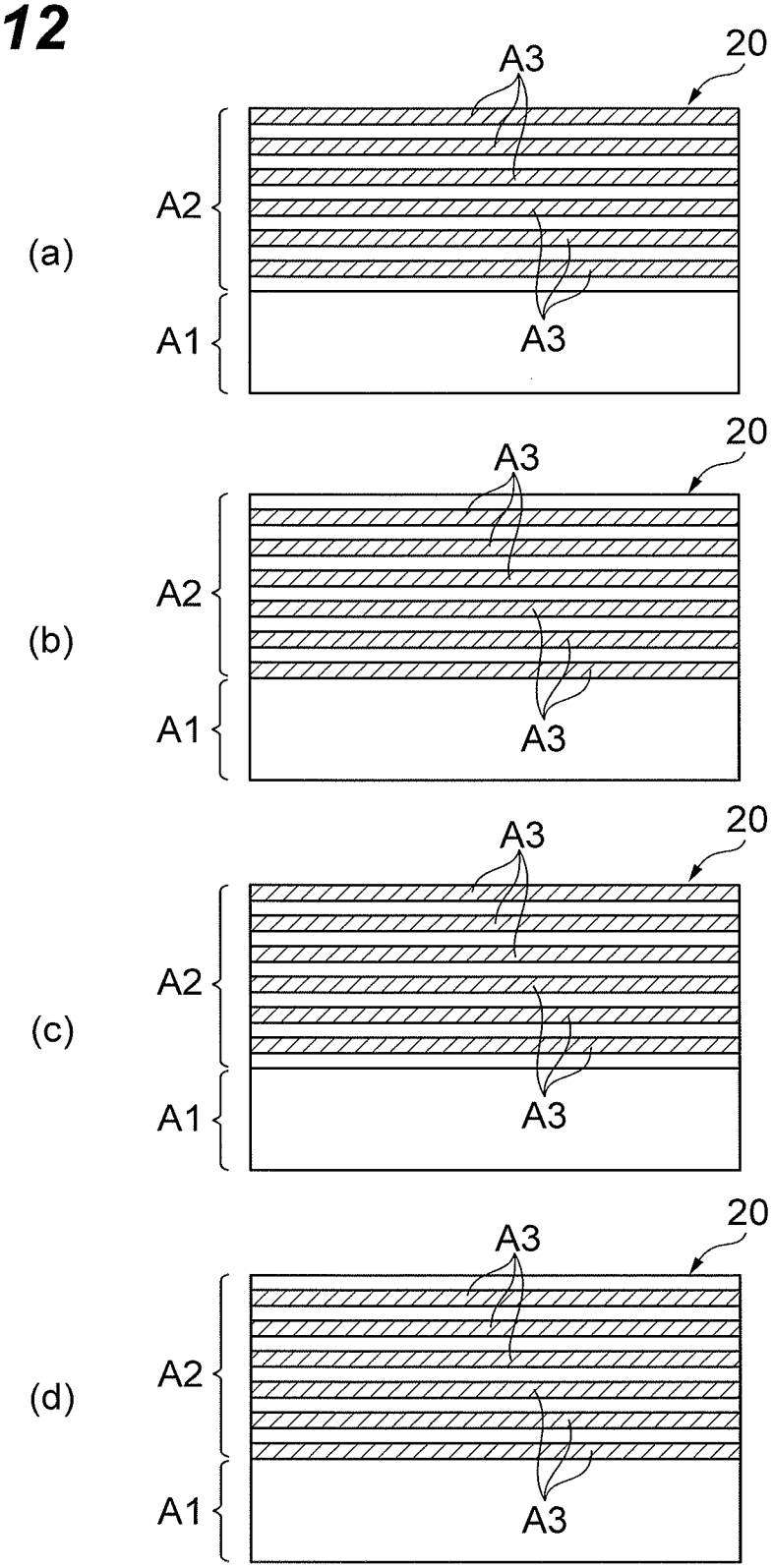
FIG. 12 includes views schematically showing a state of resetting non-readout object rows in the control method according to the first embodiment and the second embodiment.

In the above-described respective embodiments, a case of alternating resetting the odd numbered and the even numbered non-readout object rows in the respective imaging frames so that each of the pixels of the non-readout object rows can be reset once in the period of two times of imaging frames was exemplified. FIG. 12 includes views schematically showing a state of resetting non-readout object rows in such a control method. Each of (a) to (d) in FIG. 12 shows each of the four consecutive imaging frames, and in each figure, an interest region A1 consisting of one or two or more readout object rows, a non-interest region A2 consisting of two or more non-readout object rows, and non-readout object rows A3 to serve as reset objects in the respective imaging frames are shown. As shown in FIG. 12, in the above-described respective embodiments, the odd-numbered non-readout object rows A3 are reset in the first imaging frame ((a) in FIG. 12) and the third imaging frame ((c) in FIG. 12), and the even-numbered non-readout object rows A3 are reset in the second imaging frame ((b) in FIG. 12) and the fourth imaging frame ((d) in FIG. 12).

Figure 13:
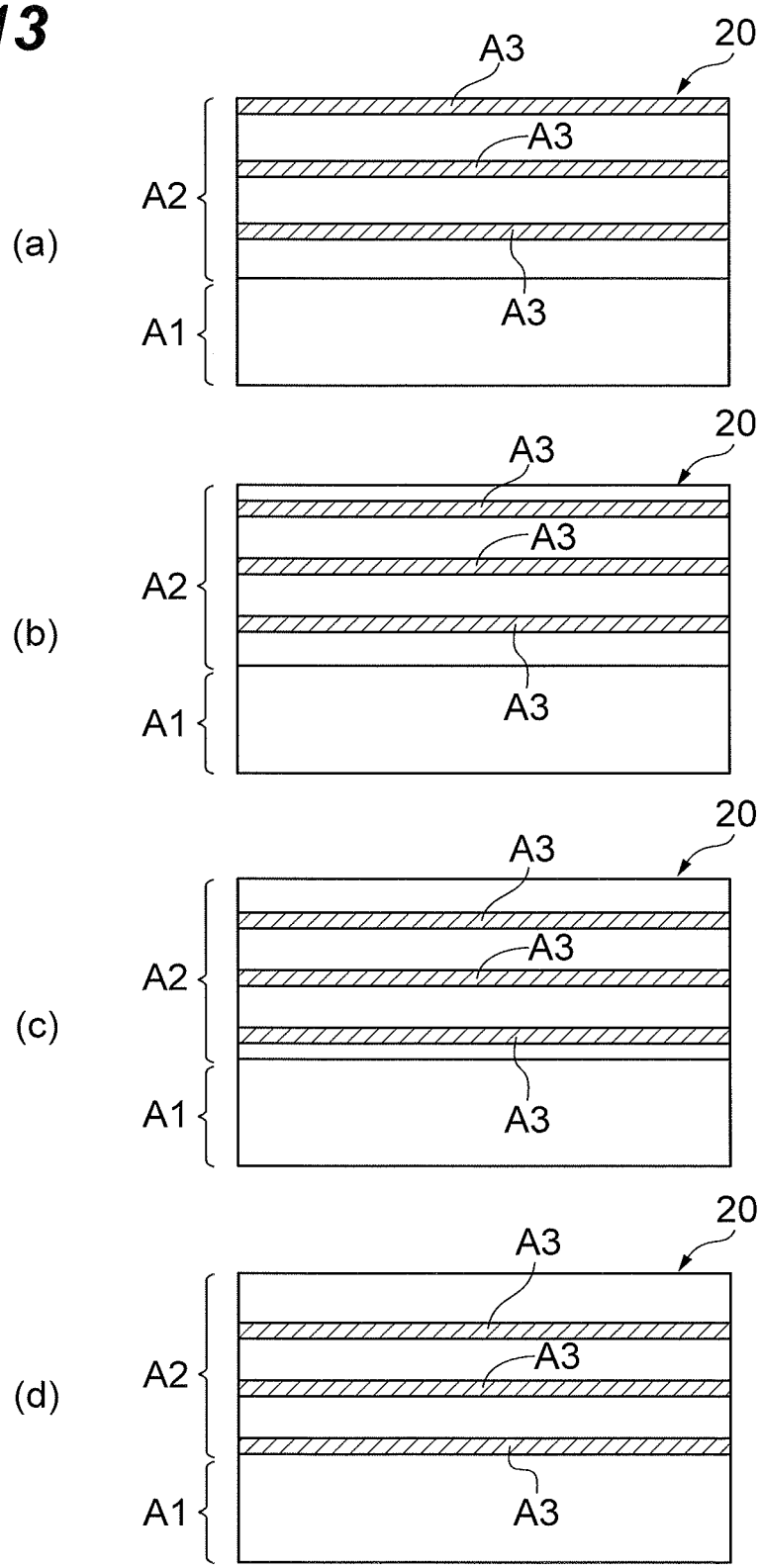
FIG. 13 includes schematic views showing a second example of a reset object row arrangement in respective imaging frames.
Figure 14:
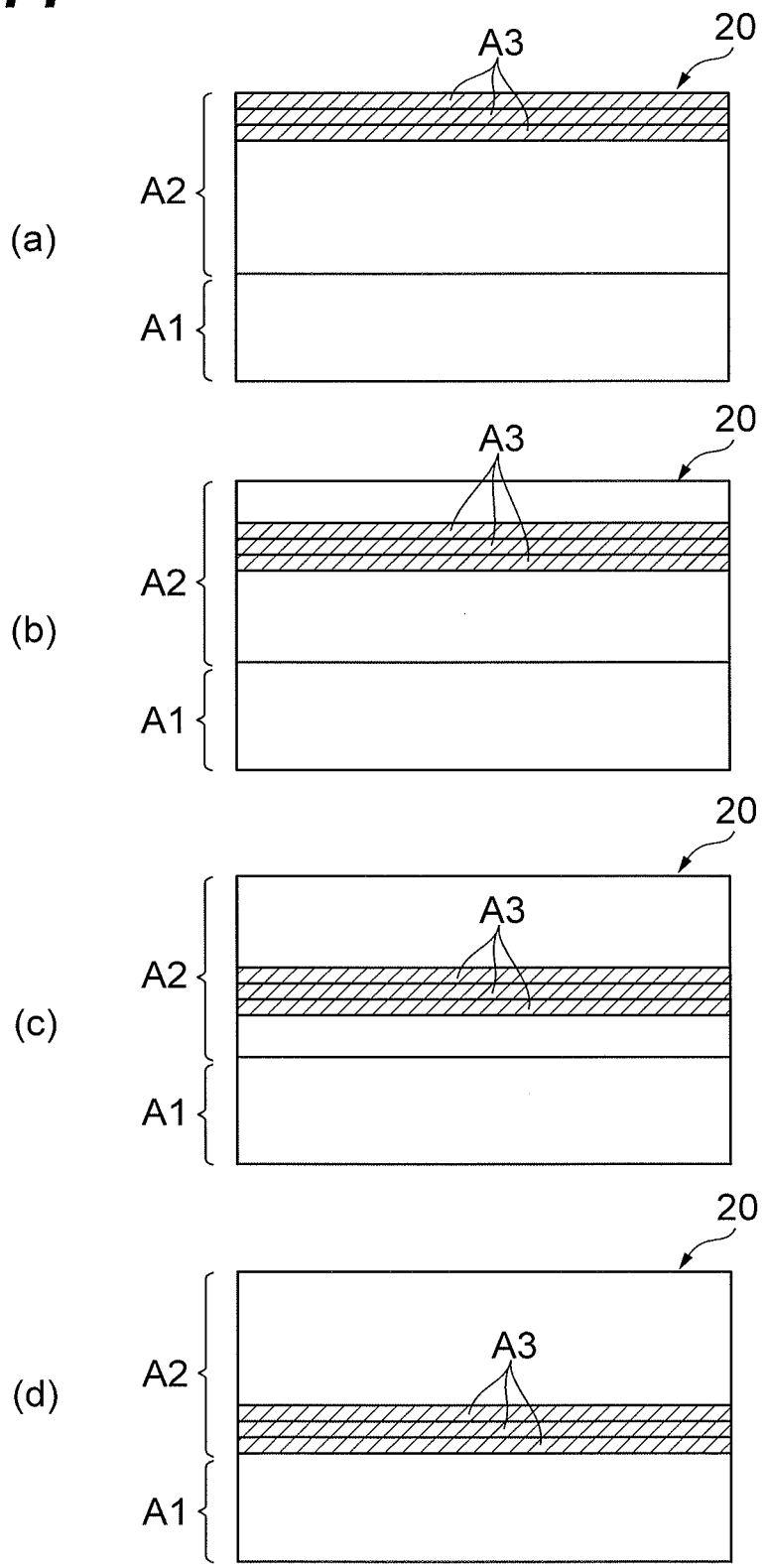
FIG. 14 includes schematic views showing a third example of a reset object row arrangement in respective imaging frames.

However, in the control method for a solid-state imaging element according to the present invention, the arrangement of reset object rows in respective imaging frames is not limited thereto. FIG. 13 includes schematic views showing a second example of a reset object row arrangement in respective imaging frames. In the example shown in FIG. 13, a plurality of rows contained in the non-interest region A2 are divided into row groups of four rows each, and resetting of one row per one frame is performed successively for each row group. Moreover, FIG. 14 includes schematic views showing a third example of a reset object row arrangement in respective imaging frames. In the example shown in FIG. 14, a plurality of rows contained in the non-interest region A2 are divided into row groups of three rows each, and one row group per one frame is successively reset. Also when reset object rows are arranged for example as in these, the same effects as those of the above-described respective embodiments can be favorably obtained.

Figure 15:
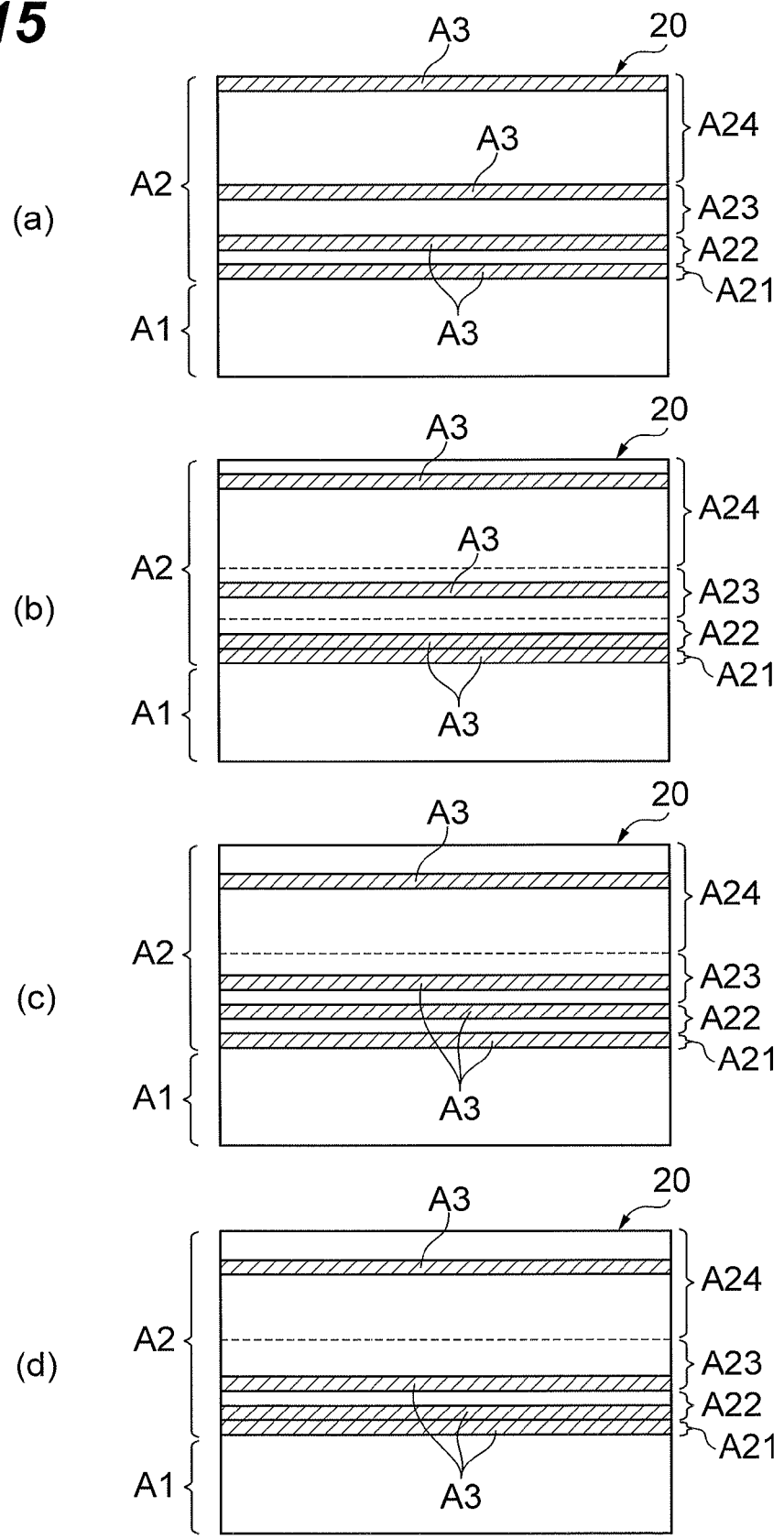
FIG. 15 includes schematic views showing a fourth example of a reset object row arrangement in respective imaging frames.

Moreover, FIG. 15 includes schematic views showing a fourth example of a reset object row arrangement in respective imaging frames. In the example shown in FIG. 15, a plurality of rows contained in the non-interest region A2 are divided into four row groups A21 to A24. Also, in this example, it is assumed that the row group A21 consists of one non-readout object row, the row group A22 consists of two non-readout object rows, the row group A23 consists of four non-readout object rows, and the row group A24 consists of eight non-readout object rows. And, in the row group A21 adjacent to the interest region A1, resetting is performed for all non-readout object row A3 for every imaging frame. That is, in the row group A21, resetting of the respective non-readout object row is performed four times in the period of four imaging frames. Moreover, in the row group A22 close to the interest region A1, one non-readout object row A3 is reset in the first imaging frame ((a) in FIG. 15) and the third imaging frame ((c) in FIG. 15), and the other non-readout object row A3 is reset in the second imaging frame ((b) in FIG. 15) and the fourth imaging frame ((d) in FIG. 15). That is, in the row group A22, resetting is performed two times for each non-readout object row in the period of four imaging frames. Moreover, in the row group A23 slightly far from the interest region A1, one non-readout object row A3 is reset in each of the first imaging frame ((a) in FIG. 15) through the fourth imaging frame ((d) in FIG. 15). That is, in the row group A23, resetting is performed once for each non-readout object row in the period of four imaging frames. Moreover, in the row group A24 farthest from the interest region A1, one non-readout object row A3 is reset in each of the first imaging frame ((a) in FIG. 15) through the eighth imaging frame (not shown). That is, in the row group A24, resetting is performed once for each non-readout object row in the period of eight imaging frames.

Figure 16:
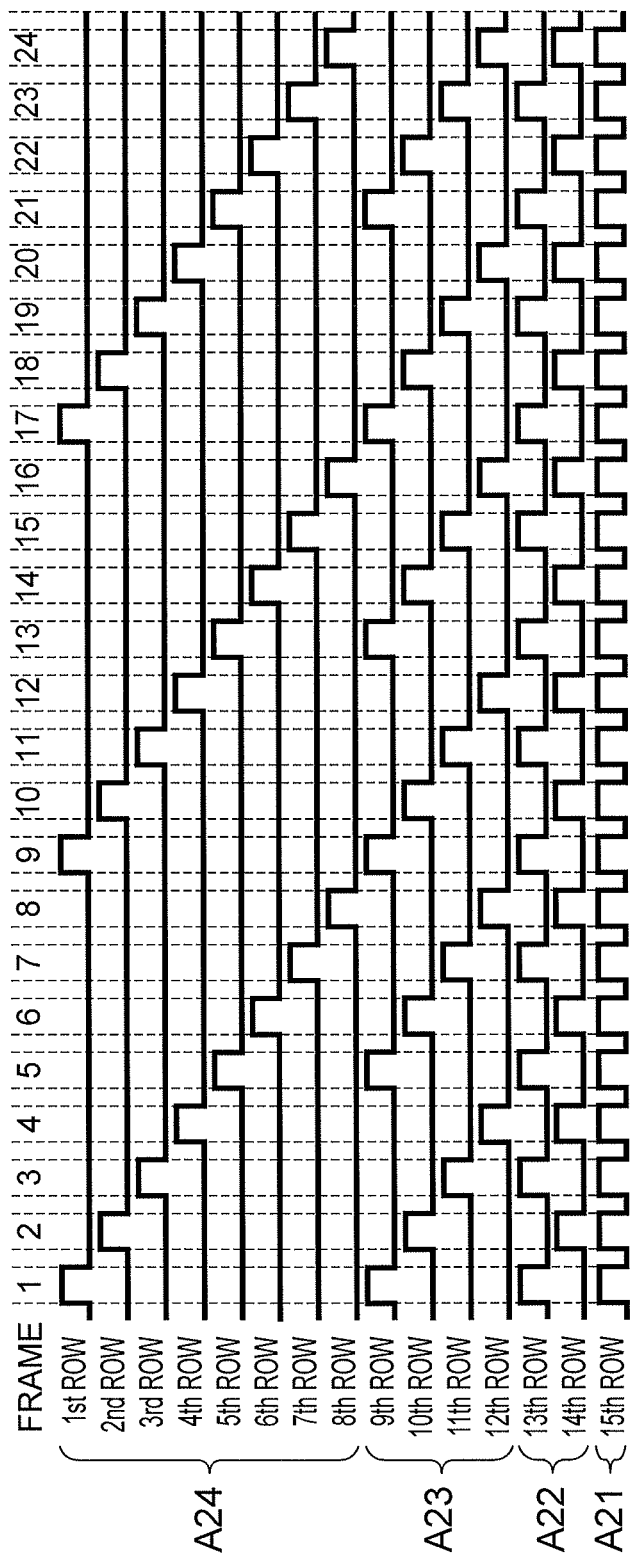
FIG. 16 is a timing chart showing a control method for realizing the reset object row arrangement shown in FIG. 15.

FIG. 16 is a timing chart showing a control method for realizing the reset object row arrangement shown in FIG. 15. FIG. 16 shows a resetting operation for each of the non-readout object rows (the first row through the fifteenth row), and for each of the imaging frames (the first imaging frame to the twenty-fourth imaging frame are shown in the figure), it is shown as high level in the imaging frame where resetting is performed, and shown as low level in the imaging frame where resetting is not performed.

As in the example shown in FIG. 15 and FIG. 16, it is preferable that the frequency of resetting of the row group A21 adjacent to the interest region A1 is greater than the frequency of resetting of the other row groups. Further, it is preferable that the closer to the interest region A1, the greater the frequency of resetting of the non-readout object row, and the farther from the interest region A1, the smaller the frequency of resetting of the non-readout object row. Accordingly, the influence on the readout object rows (interest region A1) due to a charge overflow and the like in the non-readout object rows can be more effectively suppressed, and charges accumulated in the respective pixels of the readout object rows (interest region A1) can be more accurately read out.

Figure 17:
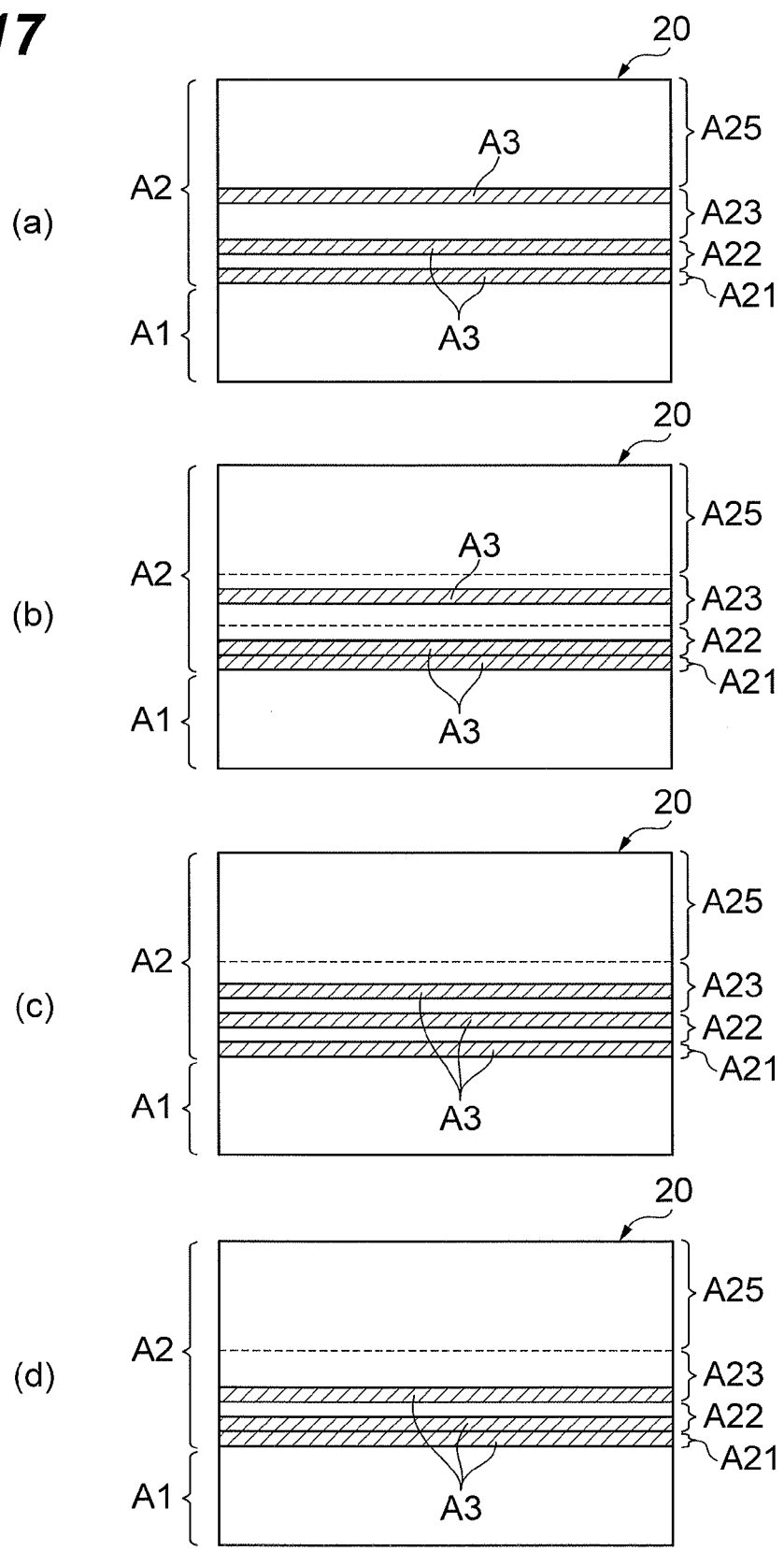
FIG. 17 includes schematic views showing a fifth example of a reset object row arrangement in respective imaging frames.

FIG. 17 includes schematic views showing a fifth example of a reset object row arrangement in respective imaging frames. In the example shown in FIG. 17, a plurality of rows contained in the non-interest region A2 are divided into four row groups A21 to A23 and A25. Also, in this example, it is assumed that the row group A21 consists of one non-readout object row, the row group A22 consists of two non-readout object rows, the row group A23 consists of four non-readout object rows, and the row group A25 consists of eight non-readout object rows. And, in the row groups A21 to A23, resetting of the respective non-readout object rows is performed in the same manner as with the foregoing fourth example. On the other hand, in the row group A25, resetting is not performed at all.

Figure 18:
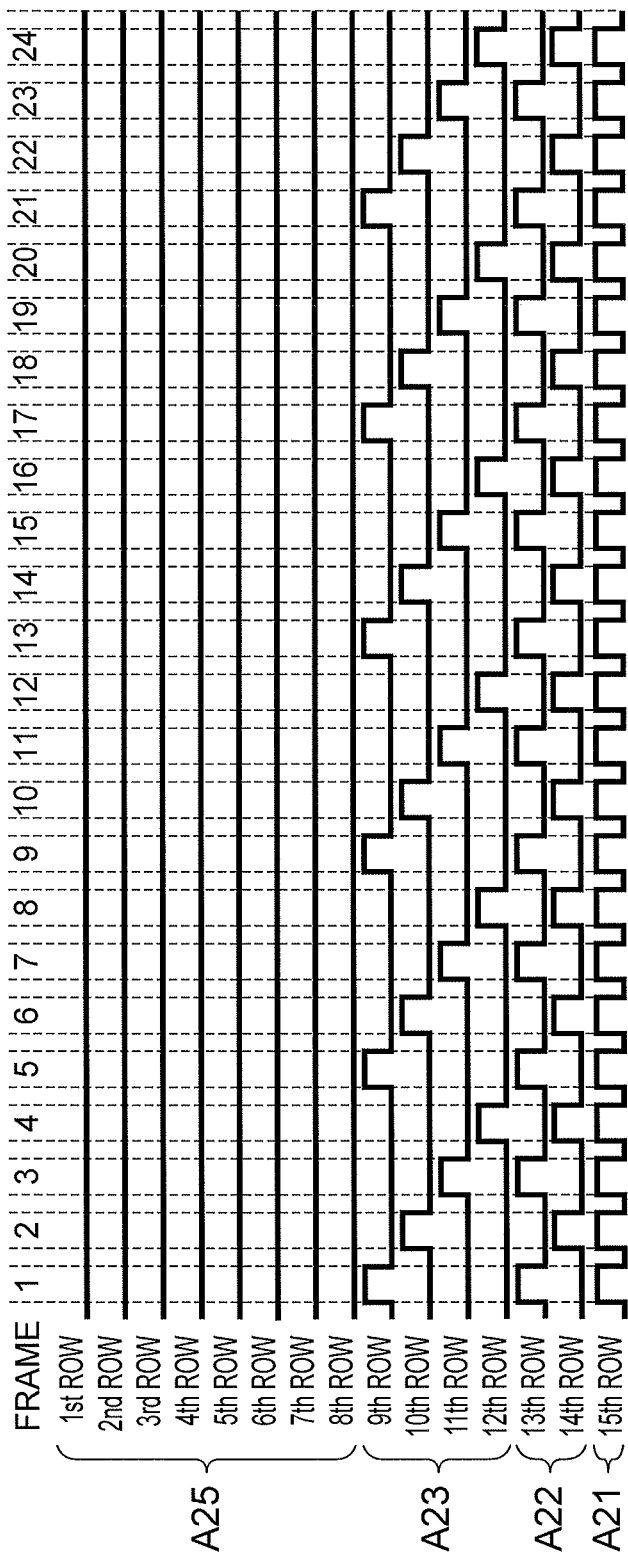
FIG. 18 is a timing chart showing a control method for realizing the reset object row arrangement shown in FIG. 17.

FIG. 18 is a timing chart showing a control method for realizing the reset object row arrangement shown in FIG. 17. FIG. 18 shows a resetting operation for each of the non-readout object rows (the first row through the fifteenth row), and for each of the imaging frames (the first imaging frame to the twenty-fourth imaging frame are shown in the figure), it is shown as high level in the imaging frame where resetting is performed, and shown as low level in the imaging frame where resetting is not performed.

As in the example shown in FIG. 17 and FIG. 18, it can also be assumed, in the respective imaging frames, not to perform resetting of other rows (in this example, the first row through the eighth row) than two or more rows (in this example, the ninth row through the fifteenth row) of the non-readout object rows. Thus, in the control method for a solid-state imaging element by the present invention, it is not necessary to perform resetting for all of the non-readout object rows, and a mode where resetting is not performed for other rows than two or more rows serving as reset objects in the non-readout object rows can also be considered. Moreover, in such a case, it is preferable that, as in this fifth example, the row group for which resetting is not performed is the row group A25 farthest from the interest region A1. And, it is more preferable that the closer the row group to the interest region A1, the greater the frequency of resetting of the non-readout object rows, and the farther the row group from the interest region A1, the smaller the frequency of resetting of the non-readout object rows. Accordingly, the influence on the readout object rows (interest region A1) due to a charge overflow and the like in the non-readout object rows can be more effectively suppressed, while load on the peripheral circuit can be further reduced.

The control method for a solid-state imaging element by the present invention is not limited to the respective embodiments and modifications described above, and various other modifications can be made. For example, in the above-mentioned embodiments and respective modifications, description has been given of an example in which the present invention is applied to a solid-state imaging device formed by film-forming of polycrystalline silicon and amorphous silicon on a glass substrate, but the present invention is not limited to such a configuration, and can also be applied to, for example, a solid-state imaging element that is fabricated on a monocrystalline silicon substrate.

FIG. 19 includes views for explaining an overflow state at partial readout time when a photodetecting region is formed on a p-type monocrystalline silicon substrate 70. The photodetecting region formed on the p-type monocrystalline silicon substrate 70 has photodiodes 24 in the respective pixels in place of the photodiodes 22 shown in FIG. 2. (a) in FIG. 19 is a schematic view showing a section that is obtained by cutting the photodiodes 24 at a cutting plane including transistors 21, and (b) in FIG. 19 is a schematic view showing a section that is obtained by cutting the photodiodes 24 at a cutting plane not including transistors 21. As shown in (a) and (b) in FIG. 19, the photodiode 24 includes an $n^+$-type semiconductor region 24a formed by ion implantation or the like for the p-type monocrystalline silicon substrate 70. Further, the $n^+$-type semiconductor region 24a is surrounded by a $p^+$-type semiconductor region 24b formed by ion implantation or the like for the p-type monocrystalline silicon substrate 70.

When charge is excessively accumulated in the photodiode 24, the potential of the n-type semiconductor region 24a of the photodiode 24 declines due to the charge. Then, when the decline in potential of the n-type semiconductor region 24a exceeds a limit, even if there is no electrical field applied to the gate electrode 21e of the transistor 21, due to a potential difference between the source region 21b and the drain region 21c, the non-connected state cannot be maintained and charge moves over the channel region 21a (the arrow E2 shown in (a) in FIG. 19). And, due to such a charge movement, an overflow to the readout wiring line $R_n$ occurs. Moreover, as shown in (b) in FIG. 19, in a part of the photodiode 24 that is not in contact with the transistor 21, when a decline in potential of the n-type semiconductor region 24a exceeds a limit, charge moves to the photodiode 24 of an adjacent pixel via the p-type monocrystalline silicon substrate 70 (the arrow E3 shown in (b) in FIG. 19).

As described above, also in the solid-state imaging element that is fabricated on a monocrystalline silicon substrate, problems due to an overflow and the like at partial readout time can occur. By the control method according to the present invention, also in a partial readout operation of such a solid-state imaging element, the time required per one imaging frame can be reduced, and also, load on the peripheral circuit can be reduced.

Moreover, an FET has been exemplified as the transistor 21 included in each pixel in the above-described embodiments and respective modifications, but the transistor 21 may be a bipolar transistor. In that case, the control terminal means a base and the current terminal means a collector or an emitter. Moreover, in the above-described embodiments, for the non-readout object rows, at least one time of removing processing is performed in the period of two times of imaging frames, and in the above-mentioned respective modifications, at least one time of removing processing is performed in the period of at most of eight times of imaging frames. However, the number of imaging frames for removing processing is not limited to these, and by performing at least one time of removing processing in the period of an arbitrary number of L times (L is an integer not less than 2) of imaging frames, the effects described in the respective embodiments can be favorably provided.

In the control method for a solid-state imaging element of the above-described embodiment, which is a control method for a solid-state imaging element including a light receiving region consisting of M×N (M is an integer not less than 3, N is an integer not less than 2) pixels each including a photodiode and a readout switch connected at one end to the photodiode that are arrayed two-dimensionally in M rows and N columns, used is an arrangement of selectively reading out, in each of the L times (L is an integer not less than 2) of imaging frames, charges accumulated in the pixels contained in one or a plurality of rows (hereinafter, referred to as readout object rows) that form a partial region of the light receiving region, and in each of the L times of imaging frames, performing a removing processing of charges accumulated in the pixels contained in a part of the two or more other rows (hereinafter, referred to as non-readout object rows) than the readout object rows, as well as performing the removing processing at least once in a period of the L times of imaging frames for each of the two or more non-readout object rows.

Moreover, the control method for a solid-state imaging element may be arranged such that a frequency of the removing processing for one or a plurality of the non-readout object rows adjacent to the readout object rows is greater than a frequency of the removing processing for the other of the non-readout object rows. Accordingly, a charge overflow to the readout object rows can be more effectively suppressed, and charges accumulated in the respective pixels of the readout object rows can be more accurately read out.

Moreover, the control method for a solid-state imaging element may be arranged such that a plurality of rows exist as the part of non-readout object rows, and in each of the L times of imaging frames, a removing processing of charges accumulated in the pixels contained in the part of non-readout object rows is simultaneously performed. As described above, by the control method for a solid-state imaging element according to this arrangement, even when a removing processing (resetting) of a plurality of non-readout object rows is simultaneously performed, current that flows in the wiring line can be reduced to reduce load on the peripheral circuit such as a power supply. And, by thus simultaneously performing a removing processing (resetting) of a plurality of non-readout object rows, the required time for the respective imaging frames can be further reduced.

Alternatively, the control method for a solid-state imaging element may be arranged such that a plurality of rows exist as the part of non-readout object rows, and in each of the L times of imaging frames, a removing processing of charges accumulated in the pixels contained in the part of non-readout object rows is successively performed. As described above, by the control method for a solid-state imaging element according to this arrangement, even when a removing processing (resetting) of a plurality of non-readout object rows is sequentially performed, the time required per one imaging frame can be reduced. And, by thus sequentially performing a removing processing (resetting) of a plurality of non-readout object rows, current that flows in the wiring line can be further reduced, and load on the peripheral circuit such as a power supply can be remarkably reduced.

Moreover, the control method for a solid-state imaging element may be arranged such that a plurality of rows exist as the part of non-readout object rows, and in each of the L times of imaging frames, the part of non-readout object rows are spaced from each other at an interval of one or more rows. Accordingly, the positions of non-readout object rows where a removing processing (resetting) is performed in the respective imaging frames can be dispersed, and a charge overflow to the readout object rows can be more effectively suppressed.

Moreover, in the control method for a solid-state imaging element of the above-described embodiment, which is a control method for a solid-state imaging element including a light receiving region consisting of M×N (M is an integer not less than 3, N is an integer not less than 2) pixels each including a photodiode and a readout switch connected at one end to the photodiode that are arrayed two-dimensionally in M rows and N columns, used is an arrangement of selectively reading out, in each of the L times (L is an integer not less than 2) of imaging frames, charges accumulated in the pixels contained in one or a plurality of rows (hereinafter, referred to as readout object rows) that form a partial region of the light receiving region, and in each of the L times of imaging frames, performing a removing processing of charges accumulated in the pixels contained in a part of the two or more rows included in the other rows (hereinafter, referred to as non-readout object rows) than the readout object rows, as well as performing the removing processing at least once in a period of the L times of imaging frames for each of the two or more rows.

Moreover, the control method for a solid-state imaging element may be arranged such that, in the L times of imaging frames, a removing processing of charges accumulated in the pixels contained in other rows than the two or more rows in the non-readout object rows is not performed. Thus, in the control method for a solid-state imaging element described above, it is not necessary to perform a charge removing processing for all of the non-readout object rows, and a case where a removing processing is not performed for other rows than the two or more rows serving as removing processing objects is also included.

INDUSTRIAL APPLICABILITY

The present invention can be applied as a control method for a solid-state imaging element capable of reducing the time required per one imaging frame and reducing load on the peripheral circuit when selectively reading out charges accumulated in pixels in a partial region of the photodetecting region.

REFERENCE SIGNS LIST

6—controlling section, 10—solid-state imaging device, 11—solid-state imaging element, 12—glass substrate, 14—polycrystalline silicon film, 16—insulating layer, 18—scintillator, 20—photodetecting region, 21—transistor, 22—photodiode, 30—vertical shift register section, 40—signal output section, 41—chip, 42—integration circuit, 42a—amplifier, 42b—capacitive element, 42c—discharge switch, 44—holding circuit, 44a—input switch, 44b—output switch, 44c—capacitive element, 61—horizontal shift register section, A1—interest region, A2—non-interest region, A3—non-readout object row, A21 to A25—row group, Hd—hold control signal, $HS_1$ to $HS_N$—column selection control signal, $P_{1,1}$ to $P_{M,N}$—pixel, $Q_1$ to $Q_M$—row selection wiring line, $R_1$ to $R_N$—readout wiring line, RE—reset control signal, $U_1$ to $U_N$—column selection wiring line, $VS_1$ to $VS_M$—row selection control signal.

The invention claimed is:

1. A control method for a solid-state imaging element including a photodetecting region having M×N (M is an integer not less than 3, N is an integer not less than 2) pixels each including a photodiode and a readout switch connected at one end to the photodiode that are arrayed two-dimensionally in M rows and N columns, and readout wiring lines arranged for each column, and connected to the other ends of the readout switches included in the pixels of corresponding columns, of
selectively reading out, in each of the L times (L is an integer not less than 2) of imaging frames, charges accumulated in the pixels contained in one or a plurality of rows (hereinafter, referred to as readout object rows) that form a partial region of the photodetecting region, and
in each of the L times of imaging frames, performing a removing processing of charges accumulated in the pixels contained in a part of the two or more other rows (hereinafter, referred to as non-readout object rows) than the readout object rows so that all of the two or more non-readout object rows are not reset, but only the part thereof is reset, as well as
performing the removing processing at least once in a period of the L times of imaging frames for each of the two or more non-readout object rows.

2. The control method for a solid-state imaging element according to claim 1, wherein a frequency of the removing processing for one or a plurality of the non-readout object rows adjacent to the readout object rows is greater than a frequency of the removing processing for the other of the non-readout object rows.

3. The control method for a solid-state imaging element according to claim 1, wherein a plurality of rows exist as the part of non-readout object rows, and
in each of the L times of imaging frames, a removing processing of charges accumulated in the pixels contained in the part of non-readout object rows is simultaneously performed.

4. The control method for a solid-state imaging element according to claim 1, wherein a plurality of rows exist as the part of non-readout object rows, and
in each of the L times of imaging frames, a removing processing of charges accumulated in the pixels contained in the part of non-readout object rows is successively performed.

5. The control method for a solid-state imaging element according to claim 1, wherein a plurality of rows exist as the part of non-readout object rows, and
in each of the L times of imaging frames, the part of non-readout object rows are spaced from each other at an interval of one or more rows.

6. A control method for a solid-state imaging element including a photodetecting region having M×N (M is an integer not less than 3, N is an integer not less than 2) pixels each including a photodiode and a readout switch connected at one end to the photodiode that are arrayed two-dimensionally in M rows and N columns, and readout wiring lines arranged for each column, and connected to the other ends of the readout switches included in the pixels of corresponding columns, of
selectively reading out, in each of the L times (L is an integer not less than 2) of imaging frames, charges accumulated in the pixels contained in one or a plurality of rows (hereinafter, referred to as readout object rows) that form a partial region of the photodetecting region, and in each of the L times of imaging frames, performing a removing processing of charges accumulated in the pixels contained in a part of the two or more rows included in the other rows (hereinafter, referred to as non-readout object rows) than the readout object rows so that all of the two or more rows included in the non-readout object rows are not reset, but only the part thereof is reset, as well as performing the removing processing at least once in a period of the L times of imaging frames for each of the two or more rows.

7. The control method for a solid-state imaging element according to claim 6, wherein in the L times of imaging frames, a removing processing of charges accumulated in the pixels contained in other rows than the two or more rows in the non-readout object rows is not performed.

8. A control method for a solid-state imaging element including a photodetecting region having M×N (M is an integer not less than 3, N is an integer not less than 2) pixels each including a photodiode and a readout switch connected at one end to the photodiode that are arrayed two-dimensionally in M rows and N columns, of selectively reading out, in each of the L times (L is an integer not less than 2) of imaging frames, charges accumulated in the pixels contained in one or a plurality of rows (hereinafter, referred to as readout object rows) that form a partial region of the photodetecting region, and in each of the L times of imaging frames, performing a removing processing of charges accumulated in the pixels contained in a part of the two or more rows included in the other rows (hereinafter, referred to as non-readout object rows) than the readout object rows, as well as performing the removing processing at least once in a period of the L times of imaging frames for each of the two or more rows, wherein in the L times of imaging frames, a removing processing of charges accumulated in the pixels contained in other rows than the two or more rows in the non-readout object rows is not performed.

9. A control method for a solid-state imaging element including a photodetecting region having M×N (M is an integer not less than 3, N is an integer not less than 2) pixels each including a photodiode and a readout switch connected at one end to the photodiode that are arrayed two-dimensionally in M rows and N columns, and readout wiring lines arranged for each column, and connected to the other ends of the readout switches included in the pixels of corresponding columns, of reading out, in each of the L times (L is an integer not less than 2) of imaging frames, charges accumulated in the pixels contained in one or a plurality or rows (hereinafter, referred to as readout object rows) that form a partial region of the photodetecting region, performing a removing processing of charges accumulated in the pixels at least once in a period of the L times of imaging frames for each of the two or more other rows (hereinafter, referred to as non-readout object rows) than the readout object rows, and in each of the L times of imaging frames, there exist at least one non-readout object row for which the removing processing is not performed.

10. A control method for a solid-state imaging element including a photodetecting region having M×N (M is an integer not less than 3, N is an integer not less than 2) pixels each including a photodiode and a readout switch connected at one end to the photodiode that are arrayed two-dimensionally in M rows and N columns, and readout wiring lines arranged for each column, and connected to the other ends of the readout switches included in the pixels of corresponding columns, of reading out, in each of the L times (L is an integer not less than 2) of imaging frames, charges accumulated in the pixels contained in one or a plurality of rows (hereinafter, referred to as readout object rows) that form a partial region of the photodetecting region, performing a removing processing of charges accumulated in the pixels at least once in a period of the L times of imaging frames for each of the two or more rows included in the other rows (hereinafter, referred to as non-readout object rows) than the readout object rows, and in each of the L times of imaging frames, in the two or more rows, there exist at least one row for which the removing processing is not performed.

* * * * *